(12) United States Patent
Jain

(10) Patent No.: US 7,638,416 B2
(45) Date of Patent: *Dec. 29, 2009

(54) METHODS OF MAKING SEMICONDUCTOR-BASED ELECTRONIC DEVICES ON A WIRE AND ARTICLES THAT CAN BE MADE USING SUCH DEVICES

(75) Inventor: Ajaykumar R. Jain, San Carlos, CA (US)

(73) Assignee: Versatilis LLC, Shelburne, VT (US)

( * ) Notice: Subject to any disclaimer, the term of this patent is extended or adjusted under 35 U.S.C. 154(b) by 38 days.

This patent is subject to a terminal disclaimer.

(21) Appl. No.: 11/764,420

(22) Filed: Jun. 18, 2007

(65) Prior Publication Data

US 2007/0278526 A1 Dec. 6, 2007

Related U.S. Application Data

(60) Provisional application No. 60/851,621, filed on Oct. 16, 2006, provisional application No. 60/851,619, filed on Oct. 16, 2006, provisional application No. 60/851,431, filed on Oct. 16, 2006.

(51) Int. Cl.
*H01L 27/10* (2006.01)
(52) U.S. Cl. ........................... 438/587; 257/202
(58) Field of Classification Search .......... 438/458, 438/459, 464, 587, 666, 461, 462, 110, 142, 438/201, 6, 400, 151, 128, 200, 411; 257/341, 257/735, E23.024
See application file for complete search history.

(56) References Cited

U.S. PATENT DOCUMENTS

| | | | |
|---|---|---|---|
| 4,057,819 A | 11/1977 | Owen et al. | |
| 5,789,770 A | 8/1998 | Rostoker et al. | |
| 5,915,179 A | 6/1999 | Etou et al. | |
| 6,133,146 A | 10/2000 | Martinez-Tovar et al. | |
| 6,157,049 A | 12/2000 | Mitlehner et al. | |
| 6,682,965 B1 | 1/2004 | Noguchi et al. | |

(Continued)

FOREIGN PATENT DOCUMENTS

JP    10270685    10/1998

(Continued)

OTHER PUBLICATIONS

International Search Report and Written Opinion dated Jan. 9, 2009 in connection with related application PCT/US2008/066632.

(Continued)

*Primary Examiner*—David Vu
*Assistant Examiner*—Suberr Chi
(74) *Attorney, Agent, or Firm*—Downs Rachlin Martin PLLC

(57) ABSTRACT

Strands of active electronic devices (AEDs), such as FETs, are made by first completely or partially forming a plurality of the AEDs on a precursor substrate. Then, one or more elongate conductors (e.g., wires) are secured to ones of the AEDs so as to electrically connected the AEDs together. After securing the conductor(s) to corresponding respective ones of the AEDs, the connected ones of the AEDs and their respective conductor(s) is/are liberated as one or more composite members from the precursor substrate by removing material from the substrate. Each of the composite substrates is further processed as needed to complete an AED strand.

31 Claims, 24 Drawing Sheets

U.S. PATENT DOCUMENTS

| | | | |
|---|---|---|---|
| 6,690,056 | B1 | 2/2004 | Reedy et al. |
| 6,885,028 | B2 | 4/2005 | Nishiki et al. |
| 7,074,644 | B2 | 7/2006 | Kimura |
| 2002/0022343 | A1* | 2/2002 | Nonaka ..................... 438/458 |
| 2003/0178623 | A1 | 9/2003 | Nishiki et al. |
| 2003/0180451 | A1 | 9/2003 | Kodas et al. |
| 2005/0042796 | A1 | 2/2005 | Wagner |
| 2005/0127363 | A1 | 6/2005 | Nishiki et al. |
| 2005/0127455 | A1 | 6/2005 | Nishiki et al. |
| 2006/0051401 | A1 | 3/2006 | Manohar et al. |
| 2006/0054879 | A1 | 3/2006 | Jin |
| 2006/0172470 | A1 | 8/2006 | Hara et al. |
| 2006/0175601 | A1 | 8/2006 | Lieber et al. |
| 2006/0216514 | A1 | 9/2006 | Fujimura et al. |
| 2006/0233694 | A1 | 10/2006 | Sandhu et al. |
| 2006/0246267 | A1 | 11/2006 | Jain |
| 2007/0200110 | A1 | 8/2007 | Jain |
| 2008/0150025 | A1 | 6/2008 | Jain |

FOREIGN PATENT DOCUMENTS

| | | |
|---|---|---|
| JP | 2004235238 | 8/2004 |

OTHER PUBLICATIONS

International Search Report and Written Opinion dated Jun. 18, 2008, regarding related International Application Serial No. PCT/US07/87236.

Preliminary Amendment dated Jul. 8, 2008, regarding related U.S. Appl. No. 11/610,195.

Office Action (Restriction Requirement) dated Jan. 22, 2009, regarding related U.S. Appl. No. 11/744,262.

International Search Report and Written Opinion dated Oct. 13, 2008, regarding related International Application Serial No. PCT/US08/60483.

Preliminary Amendment dated Jul. 8, 2008, regarding related U.S. Appl. No. 11/744,262.

U.S. Appl. No. 11/610,195, filed Dec. 13, 2006, entitled: Method of Making Semiconductor-Based Electronic Devices on a Wire and By Forming Freestanding Semiconductor Structures; Inventor: Ajaykumar R. Jain.

U.S. Appl. No. 11/744,262, filed May 4, 2007, entitled: Methods of Making Semiconductor-Based Electronic Devices on a Wire and Articles That Can Be Made Thereby; Inventor: Ajaykumar R. Jain.

Erich Gross, "Woven/Textile Integrated Displays," The Erik Jonsson School of Engineering and Computer Science, downloaded Feb. 23, 2006.

M.S. Shur, R. Gaska, S.L. Rumyantsev, R. Rimeika and J. Sinius, "Semiconductor Thin Films and Thin Film Devices for Electrotextiles," Proceedings of Workshop on Frontiers in Electronics, St. Croix, Virgin Islands, 2002.

D. Marculescu, R. Marculescu, N. Zamora, P. Stanley-Marbell, P. Khosla, S. Park, S. Jayaraman, S. Jung, C. Lauterbach, W. Weber, T. Kirstein, D. Cottet, J. Grzyb, G. Troster, M. Jones, T. Martin, Z. Nakad, "Electronic Textiles: A Platform for Pervasive Computing," Proceedings of the IEEE, vol. 91, No. 12, Dec. 2003, pp. 1995-2018.

Josephine B. Lee and Vivek Subramanian, "Weave Patterned Organic Transistors on Fiber for E-Textiles," IEEE Transactions on Electron Devices, vol. 52, No. 2, Feb. 2005, pp. 269-275.

Josephine B. Lee and Vivek Subramanian, "Organic Transistors on Fiber: A first step towards electronic textiles," 0-7803-7873-3/03 IEEE 2003.

Response to Office Action dated Jul. 20, 2009, in connection with related U.S. Appl. No. 11/744,262, filed May 4, 2007, Inventor: Ajaykumar R. Jain.

Office Action dated May 28, 2009, in connection with related U.S. Appl. No. 11/744,262, filed May 4, 2007, Inventor: Ajaykumar R. Jain.

\* cited by examiner

METHODS OF MAKING SEMICONDUCTOR-BASED ELECTRONIC DEVICES ON A WIRE AND ARTICLES THAT CAN BE MADE USING SUCH DEVICES

RELATED APPLICATION DATA

This application claims the benefit of priority of U.S. Provisional Patent Application Ser. No. 60/851,619 filed Oct. 16, 2006, and titled "Novel Manufacturing Method for Field Effect Transistor," U.S. Provisional Patent Application Ser. No. 60/851,621 filed Oct. 16, 2006, and titled "Method of Making Flexible Transparent Conductive Films" and U.S. Provisional Patent Application Ser. No. 60/851,431 filed Oct. 16, 2006, and titled "Novel Method Of Making Flexible Electronics." Each and every one of the foregoing applications is incorporated by reference herein in its entirety.

FIELD OF THE INVENTION

The present invention generally relates to the field of semiconductor electronics. In particular, the present invention is directed to methods of making semiconductor-based electronic devices on a wire and articles that can be made using such devices.

BACKGROUND

With the continuing evolution of the electronics industry, new techniques are continually needed to allow not only incremental progress, but also (albeit typically less often) major technological leaps that become the impetus for another round of incremental progress. For example, in the manufacturing of displays, for example, flat-panel displays such as video, television and computer monitors, among others, substrate sizes have been increasing incrementally over the approximately seven generations of flat panel display technology. The initial substrate size of the first generation of flat panel displays was roughly 320 mm×400 mm. This has increased to about 1800 mm×2100 mm in the current (seventh) generation of flat panel displays. However, these ever-increasing substrate sizes create significant manufacturing and engineering challenges with regard to their use, handling and transportation. In addition, the upfront capital investment in infrastructure required to process these large sheets of glass for each subsequent generation of fabrication has ballooned to upwards of $2 billion per fabrication facility.

Furthermore, future trends in the display/electronics industry suggest that future display and electronic products will be made on flexible/conformal substrates. This transition is seen as inevitable to service the ever present need and desire to reduce the size, weight and cost of devices we use without sacrificing performance. A wide gamut of devices, such as displays, electronics and sensors, to name a few, would benefit from methodologies that would result in the mass production of ruggedized, light-weight, portable, small-form-factor, less power hungry and lower-cost devices. Moreover, new and novel markets and opportunities could be addressed and opened-up if these devices could be made flexible and/or conformal.

To counter the ever-growing substrate-size dilemma and to service future flexible display needs, attempts have been, and are being, made to develop manufacturing processes that would allow for roll-to-roll, or reel-to-reel (also call "web coaters"), technologies. These technologies would allow flexible substrates, such as polymer/plastic foils and metal foils, to be substituted for rigid glass substrates. However, attempts so far have had limited success, primarily due to the complexity of manufacturing active electronic devices, such as field-effect transistors (FETs) that form the basis of most electronic circuitry (note that thin-film transistors (TFTs) are typically in the form of FETs). Typical manufacturing of such devices requires multiple coatings deposited at high temperatures and interspaced with multiple photolithographic patterning steps.

It is commonly known that polymers/plastics, if used as substrates, severely limit the maximum temperature that may be used during device manufacturing. In addition, to prevent undue out-gassing and contamination of equipment and devices during coating deposition, these substrates need to undergo a complex and time-consuming pre-bake thermal cycling step. This step also serves to expel moisture and humidity from the native polymer substrate, thereby stabilizing the coefficient of thermal expansion of the substrate, which is helpful in the photolithographic patterning and pattern alignment steps. Metal foils are more resilient and tend to be immune from this temperature limit imposed by polymer/plastic substrates. However, to date, TFT devices made on metal foils have exhibited low electronic performance due to contamination effects and "unknowns" attributed to high surface-roughness of starting metal substrates.

In addition, the use of flexible substrates has placed heavy demands on engineering new ways and equipment to address dimensional stability of substrates during lithography, mechanics for handling substrate curvature, registration accuracy and consistency of placement of TFTs and electrodes. Furthermore, flexible polymer/plastic substrates have had issues with moisture absorption and resistance to solvents and other chemicals. One of the more significant of these technical challenges that has slowed, and even stymied, attempts at roll-to-roll manufacturing of electronic devices on either polymer/plastic or metal foils is the issue with photolithographic registration and alignment due to the number of coatings and photomasking steps involved in the manufacturing of traditional TFTs.

Pick-and-place techniques wherein complete and/or partial circuits are manufactured in a silicon (semiconductor) wafer and then transferred onto a separate substrate and interconnected to form electronic articles have been known in the semiconductor industry for some time. A variant of the pick and place method is the "fluidic suspension assembly," or FSA, process, a technique patented by Alien Technology, wherein the manufactured "circuits" are floated into specific locations using a fluidic media and surface chemistry.

Yet another technique, pioneered by Dr. John Rogers and others at the University of Illinois, is a so-called "top down" micro-technology approach to creating high performance active flexible electronic circuits. In short, this group of researchers has created free-standing micro- and nano-scale objects of single crystal silicon (and other semiconductors) from silicon-on-insulator wafers by lithographic patterning of resist, subsequently etching the exposed top silicon, and removing the underlying $SiO_2$ to lift-off the remaining silicon. The free-standing silicon objects so obtained are then deposited and patterned, by dry transfer printing or solution casting, onto mechanically pliant substrates (like plastic) to yield mechanically flexible thin film transistors. They have coined these objects as "microstructured silicon." Modified versions of the same basic technique are being pursued by Dr.

Max Lagally at the University of Wisconsin (SiGe and Strained SiGe crystals), Triton Systems and Si2Technologies, among others.

SUMMARY OF THE DISCLOSURE

In one embodiment, a method of making at least one active electronic device strand is provided. The method includes providing a precursor substrate; at least partially forming each of a plurality of active electronic devices on the precursor substrate; after the at least partial forming of the each of the plurality of active electronic devices, securing an elongate conductor to the precursor substrate so as to interconnect ones of the plurality of active electronic devices; and after the securing of the elongate conductor to the precursor substrate, removing portions of the precursor substrate so as to liberate a composite member from the precursor substrate, the composite member including the elongate conductor and ones of the plurality of active electronic devices interconnected by the elongate conductor.

In another embodiment, a method of making at least one field-effect transistor (FET) strand is provided. The method includes providing a precursor substrate; forming a plurality of FETs on the precursor substrate, the plurality of FETs having a plurality of corresponding respective source regions, a plurality of corresponding respective drain regions and a plurality of corresponding respective gate regions; securing an elongate conductor to the plurality of corresponding respective source regions so as to electrically connected the plurality of corresponding respective source regions together; and following the securing of the elongate conductor, liberating an FET composite member from the precursor substrate.

In still another embodiment, an electronic circuit is provided. The circuit includes a first field-effect transistor (FET) strand comprising a first prefabricated elongate conductor and a first FET that includes a first source secured to said first prefabricated elongate conductor, said first FET further including a first drain; and a second FET strand comprising a second prefabricated elongate conductor and a second FET that includes a second source secured to said second prefabricated elongate conductor, said second FET further including a gate electrically connected to said first drain of said first FET.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown iii the drawings, wherein.

DETAILED DESCRIPTION

The present disclosure is directed to methods of making active electronic devices (AEDs), such a field-effect transistors (FETs), among others, on a wire, on a wire-like substrate and on other substrates so as to create strands of such AEDs. The disclosed methods utilize techniques for forming semiconductor structures that differ from traditional wafer-wide deposit-and-etch techniques used to form more traditional devices, such as CMOS FETs, finFETs, etc. As will be described below in greater detail, such a method may be used to create novel electronic device structures, such as flexible electronic structures and novel FET structures that can be used to create any of a variety of unique electronic articles, for example, displays, lighting, and sensors, among many others, that utilize FETs and other active electronic devices. Important flexible electronic structures that can be made using methods of the present disclosure include "transistor wire," "transistor ribbon," i.e., wire or wire-like bodies (e.g., ribbon), and other AED strands that contain a plurality of transistors or other active electronic devices along their lengths. Such an AED strand may be used to create any of a variety of flexible, rigid and/or conformal components of electronic articles, ranging from pixel-array components for displays to sensor-array components of large-scale sensors. A fuller description of uses of the methods and structures of the present disclosure appear in U.S. Provisional Patent Application Ser. No. 60/816,671 (hereinafter "the '671 application) and U.S. Provisional Patent Application Ser. No. 60/797,795 (hereinafter "the '795 application) and U.S. patent application Ser. No. 11/610,195 (hereinafter "the '195 application") (collectively "the '671, '795 and '195 applications"), which are each incorporated herein by reference in its entirety.

In one embodiment, the present disclosure is directed to a method of making one or more electronic devices on a wire, which includes wire-like structure (ribbon, for example), wherein various layers and other structures are formed on the wire so as to encapsulate the wire. The following examples are primarily directed to the formation of FETs, though those skilled in the art will readily understand how to adapt the techniques disclosed herein to a variety of electronic devices, such as MIM diodes, ring diodes, thick and thin film transistors, CMOS and MOS devices, FETs, MOSFETs, MESFETs, BJTs, IGBTs, and similar devices.

Figure 1:
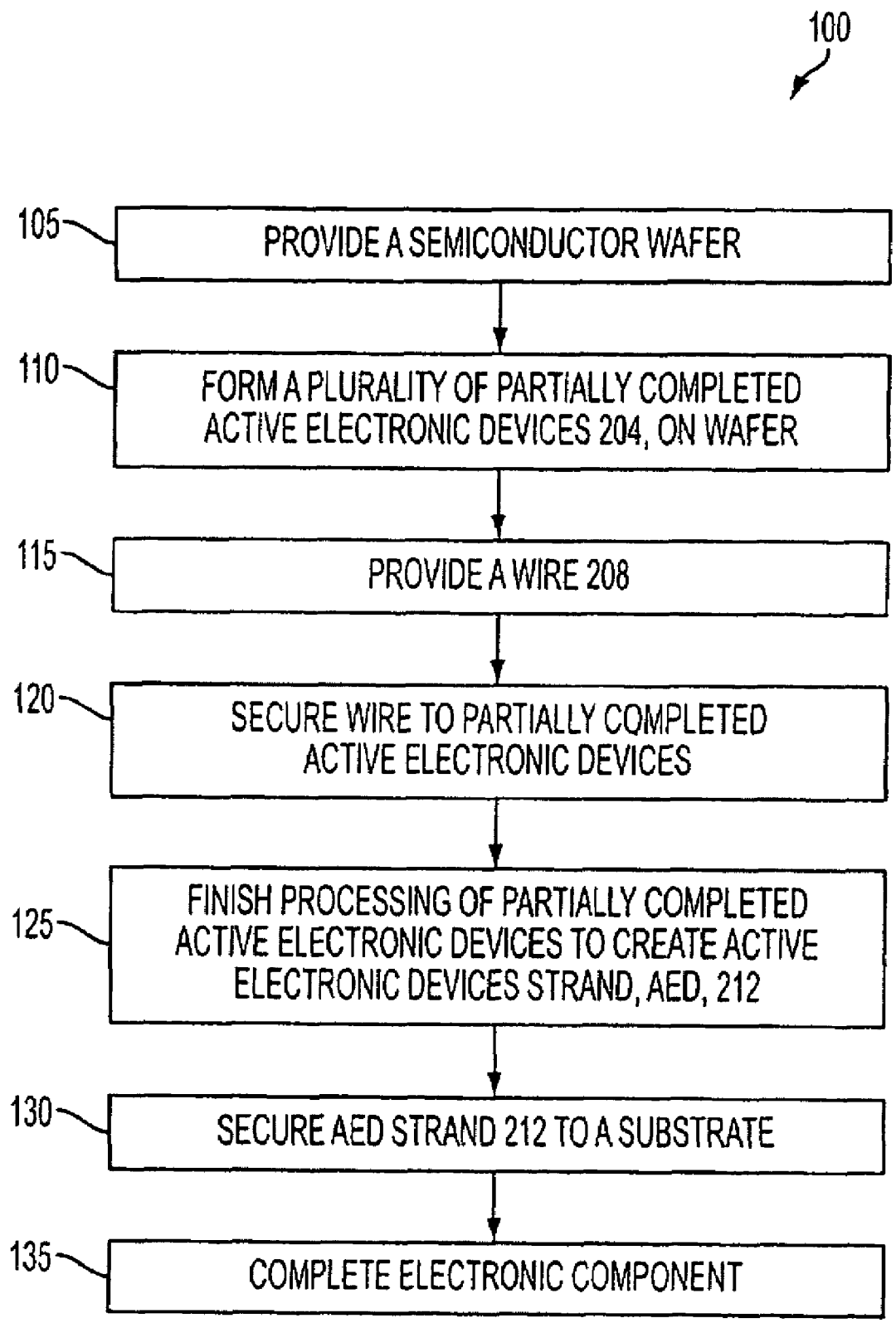
FIG. 1 is a flow diagram illustrating a method of making an electronic component using an active electronic device (AED) strand.

Referring now to FIG. 1, and also to FIGS. 2 and 3, FIG. 1 contains a high-level flow diagram 100 illustrating the general flow of steps that may be used in forming an electronic component, for example, pixel matrix backplane, emitter array, sensor array, etc., using a transistor strand made in accordance with one or more of the methods described below or contemplated by the broad scope of this disclosure. At step 105, a semiconductor substrate (not shown) having the desired physical shape, surface finish and material composition is provided. Semiconductor materials suitable for the substrate are described in more detail in the '795 application. Once the substrate has been provided, at step 110 a plurality of partially and/or fully completed active electronic devices 204, for example, FETs are formed on the substrate by iteratively depositing/growing coatings, implanting particles and patterning and etching or otherwise removing portions of the coatings and substrate in an appropriate manner.

At step 115, an electrically conductive wire 208, or other elongate conductor having a desired cross-sectional shape and material composition is provided. Such cross-sectional shapes include simple shapes, for example, round, triangular, rectangular, etc., as well as more complex shapes, such as a dumbbell shape. Cross-sectional shapes and materials suitable for use with wire 208 selected in step 115 are described in more detail in the '795 and '195 applications. At step 120, wire 208 is secured to the partially or fully completed active electronic devices 204.

Once wire 208 is secured, at step 125 additional processing of the plurality of partially completed active electronic devices 204 (FIG. 2), for example, FETs, is done as necessary to create an AED strand 212 of such devices. As will be described in greater detail below, various processing techniques are used as needed to build the type of electronic devices 204 and AED strand 212 at issue. Examples of these processing techniques include techniques for reducing the surface roughness of starting wire 208, if needed, techniques for depositing/growing layers (not shown) of various conducting, insulating and semiconducting layers and techniques for patterning and etching such layers. Specific examples of these and other techniques that may be used in forming electronic devices 204 and AED strand 212 are described in more detail in the '671, '795 and '195 applications.

After AED strand 212 has been created, at step 130 AED strand 212 and electronic devices 204 are secured to an appropriate substrate 300 (FIG. 3) and electrically connected together and/or to other devices (not shown) as needed, as illustrated by connections 304. Electronic devices 204 (and AED strand 212) may be secured to a substrate using any appropriate securing technique. For example, if electronic devices 204 (FIG. 2) are FETs having corresponding respective gate electrodes (not shown), substrate 300 may include patterned wires (not shown) that contacts respective ones of the gate electrodes. In this case, electronic devices 204 may be bonded to the wires using a technique suitable to maintain the electrical continuity between the wire and gate electrode. As described in the '795 and '195 applications, substrate 300 may be either a permanent or temporary substrate selected for the particular electronic component at issue.

There are several ways in which electronic devices 204 and AED strand 212 can be applied to a substrate, such as substrate 300. For example, as shown in FIG. 3, AED strand 212 may be applied to substrate 300 essentially as is, i.e., as a continuous strand, by itself or with other AED strands (not shown). If used by itself, it is noted that AED strand 212 may be folded and/or curved so as to be applied to substrate 300 in a desired continuous pattern, such as a back-and-forth pattern or a rectangular spiral pattern (not shown) that, for example, starts or ends near the periphery of the substrate and ends or starts near the center of the substrate. AED strand 212 may, but need not necessarily, remain continuous in the completed electronic component as shown in FIG. 3. Depending on the requirements for connectivity between/among the various electronic devices 204 and/or other components, connections 304 may be made in any suitable manner, such as by applying one or more patterned conductive layers to substrate 300.

After electronic devices 204 and/or AED strand 212 have been secured to substrate and electrically connected as needed at step 130, at step 135 the electronic component may be completed. Steps for completing the electrical component may include, but are not limited to, any one or more of the following: encasing electronic devices 204 and AED strand 212 in insulation, providing pixel electrodes and other conductive layers/structures, removing substrate 300, if temporary and/or affixing to another substrate, forming other electronic devices as needed to complete the electronic component. More detailed descriptions of these and other processing steps that may be used in completing an electronic component may be found in the '795 and '195 applications.

It is noted that in addition to many embodiments of AED strand 212 being flexible, substrate 300 may be flexible as needed to suit a particular application. This flexibility has many practical implications as it relates, for example, to future flexible display and flexible macro-electronics and to general electronics platforms. For example, flexible electronic components made in accordance with methods of the current disclosure may be made conformal (i.e., able to conform to a curve and remain so curved), flexible (i.e., able to flex under applied force and revert back to its original shape when the applied force is removed), rollable (i.e., able to be rolled around an object, for example, a cylinder, back and forth under applied force) and/or foldable (i.e., able to be folded back and forth along an axis under an applied force). Those skilled in the art will readily appreciate that conformal, flexible, rollable and foldable electronic components can be optimized by properly orienting the AED strand(s).

Figure 2:
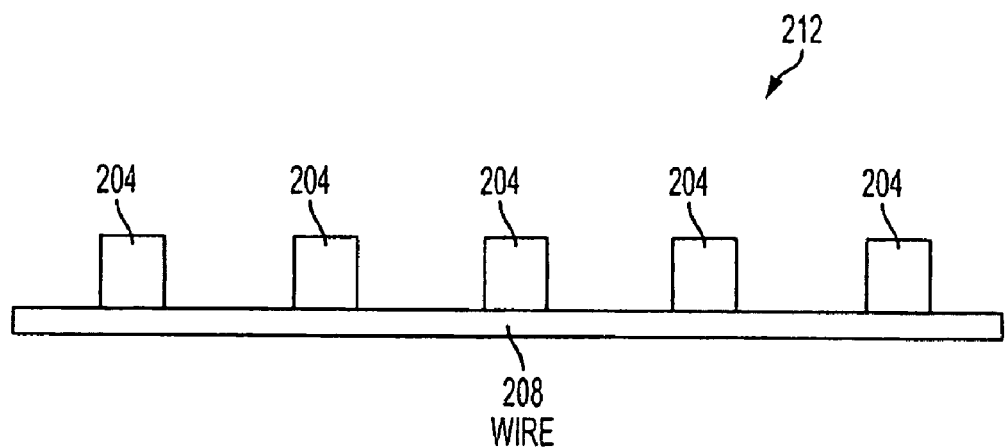
FIG. 2 is a schematic diagram illustrating an AED strand that may be made using methodology of the present disclosure.
Figure 3:
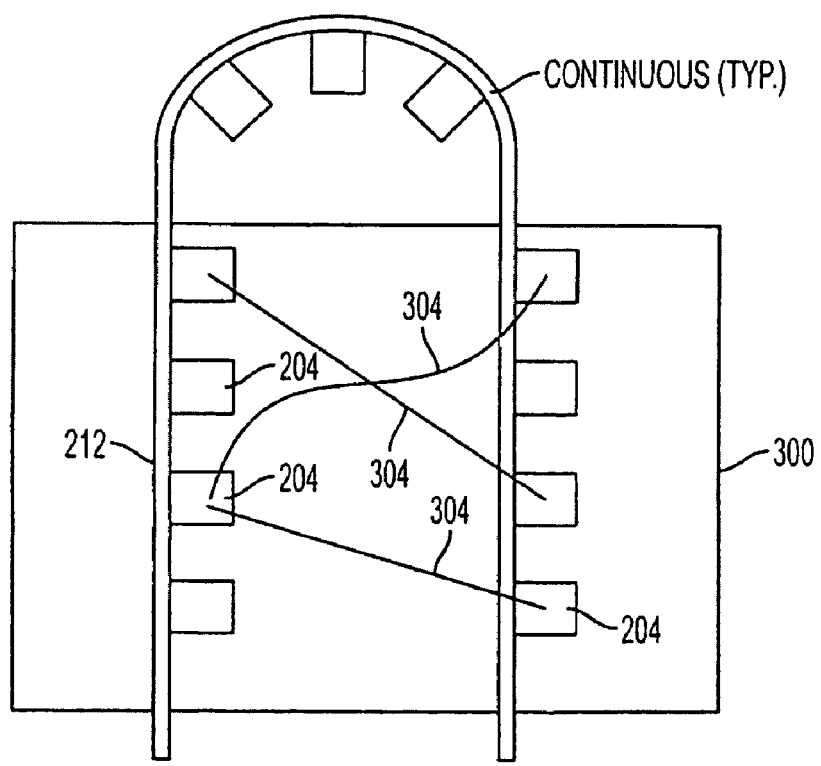
FIG. 3 is a schematic diagram illustrating an electronic component made in accordance with the method of FIG. 1.

As mentioned above, an AED strand, such as AED strand 212 of FIG. 2, may be made using a variety of techniques. Examples of these techniques are described immediately below.

In a first example, the electronic devices of an AED strand made in accordance with methods of the present disclosure are FETs that utilize single crystal silicon for the channel regions of the FETs. FIG. 5 illustrates a method 500 of making a transistor strand 400 (FIG. 4W) that includes a plurality of FETs 404 formed on a wire 448.

Figure 4A:
FIGS. 4A-W each show a cross-sectional view (transverse or longitudinal, as appropriate) of a transistor strand at a particular stage of manufacture.
Figure 4B:
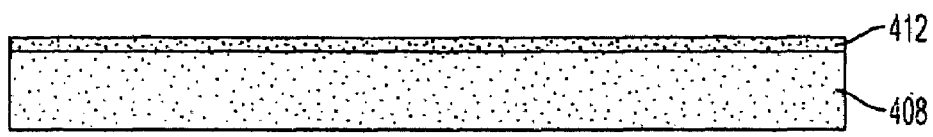
Figure 4C:
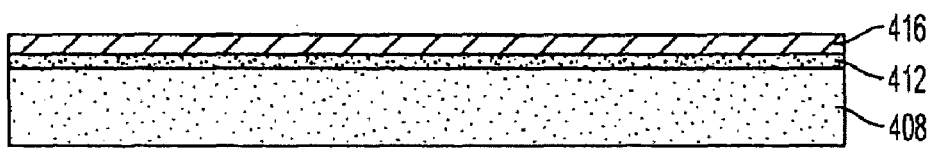
Figure 4D:
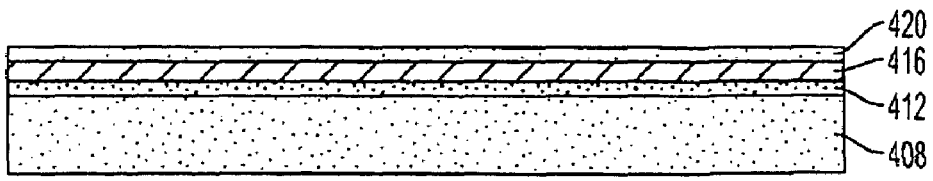
Figure 4E:
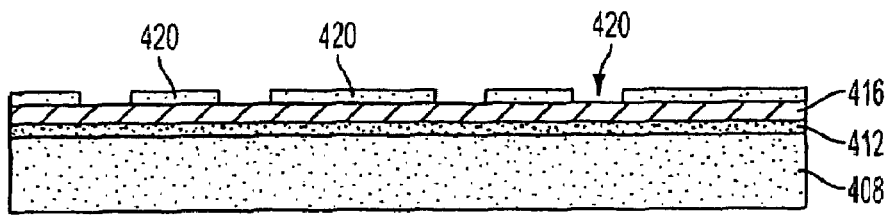
Figure 4F:
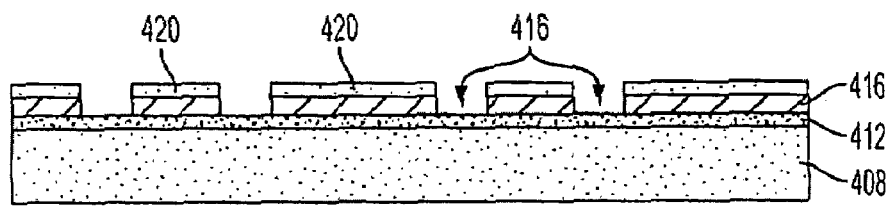
Figure 4G:
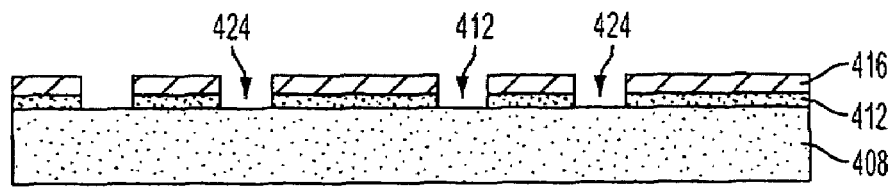
Figure 4H:
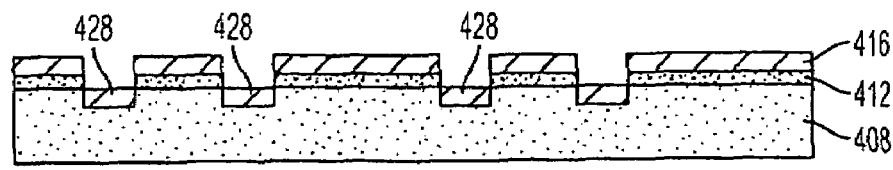
Figure 4I:
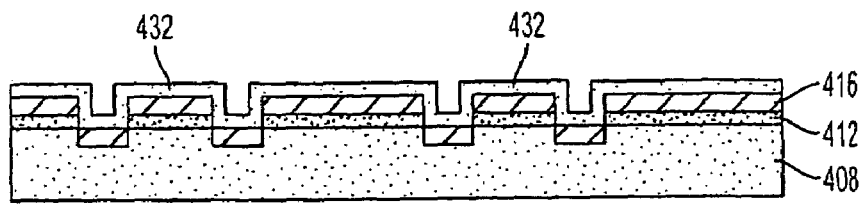
Figure 4J:
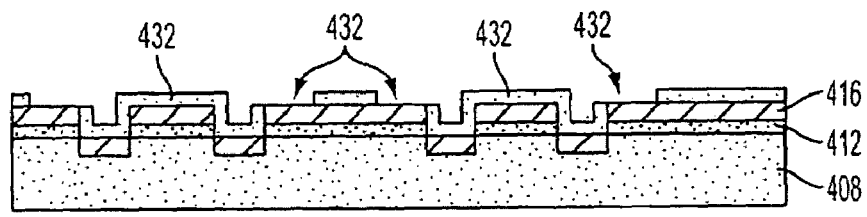
Figure 4K:
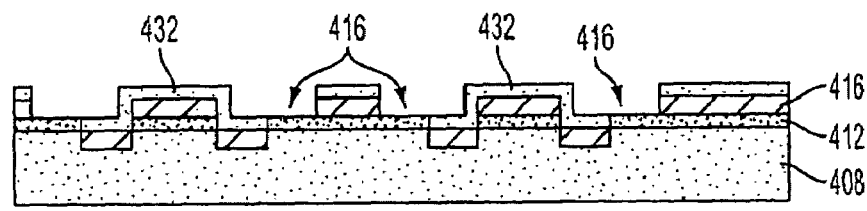
Figure 4L:
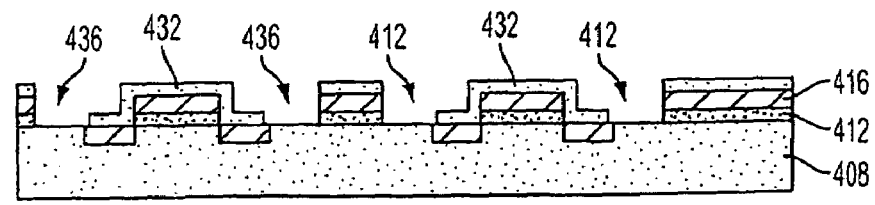
Figure 4M:
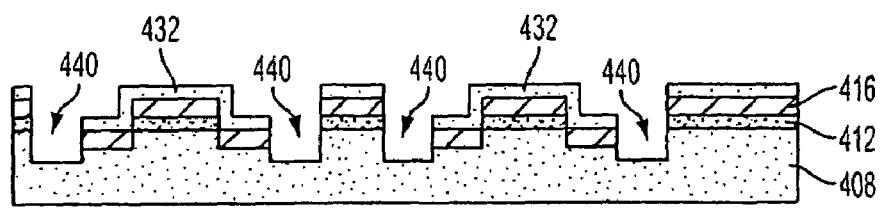
Figure 4N:
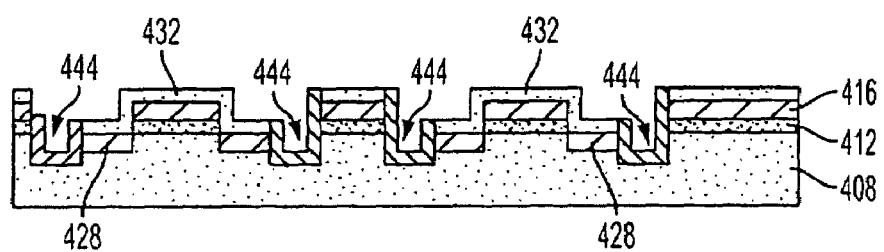
Figure 4O:
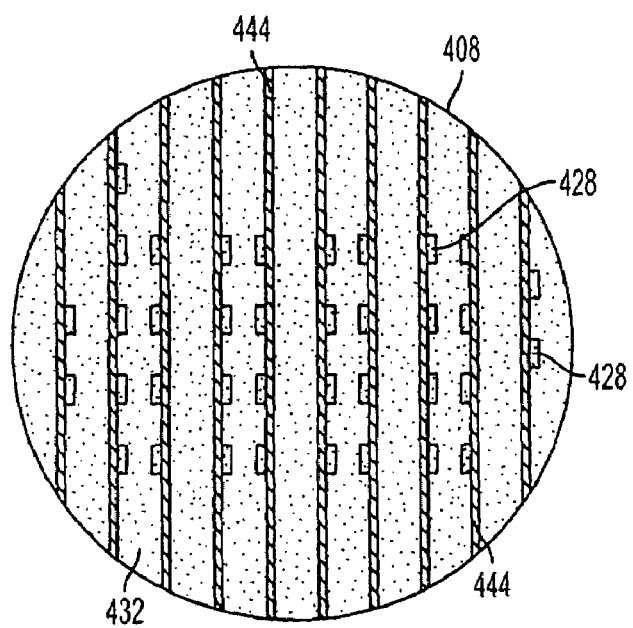
Figure 4P:
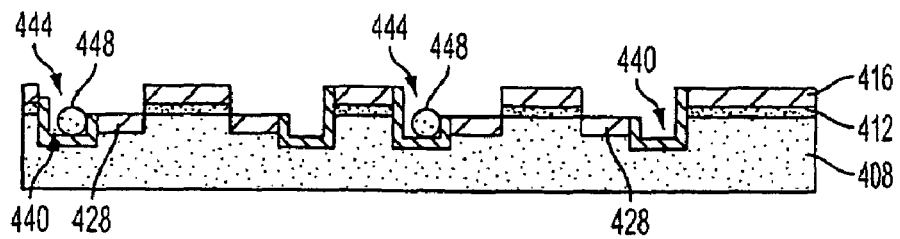
Figure 4Q:
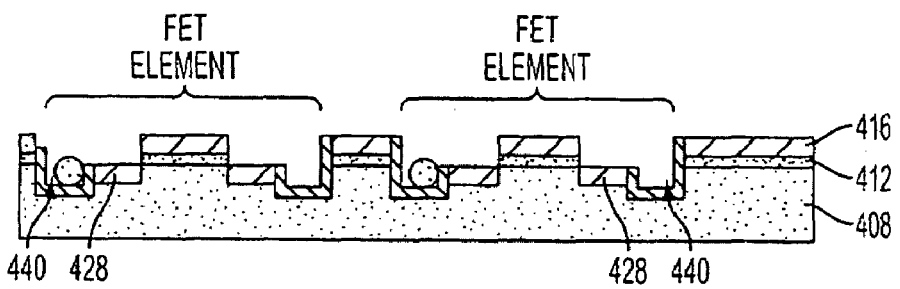
Figure 4R:
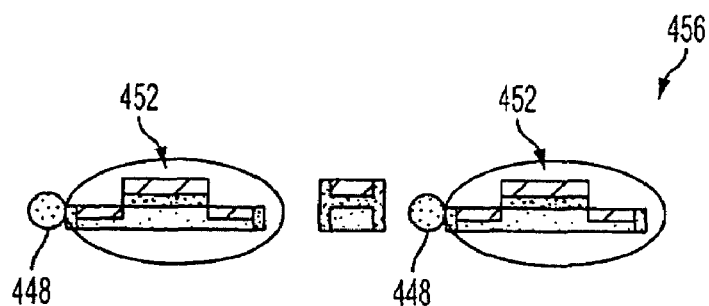
Figure 4S:
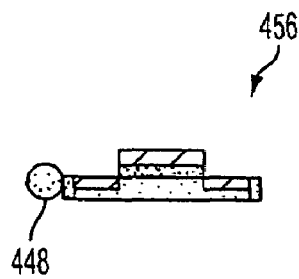
Figure 4T:
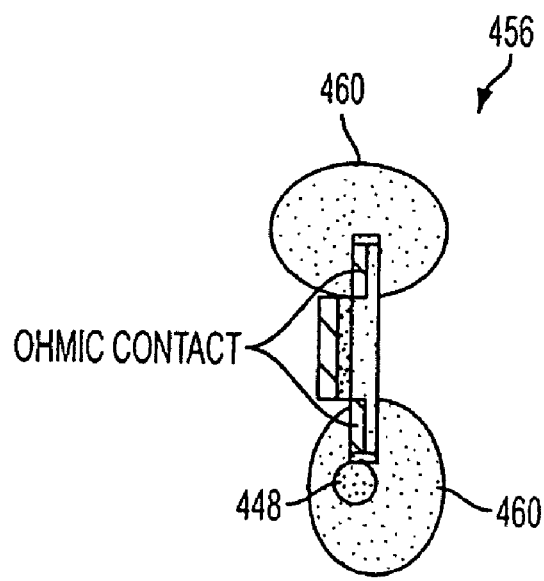
Figure 4U:
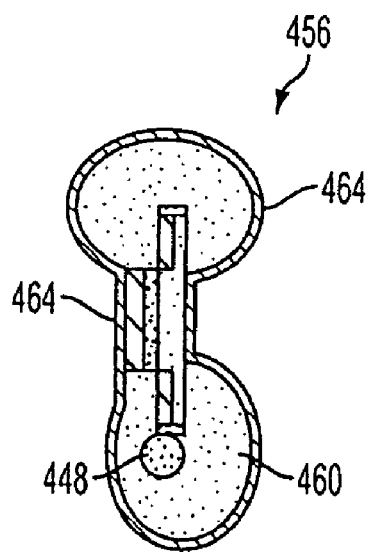
Figure 4V:
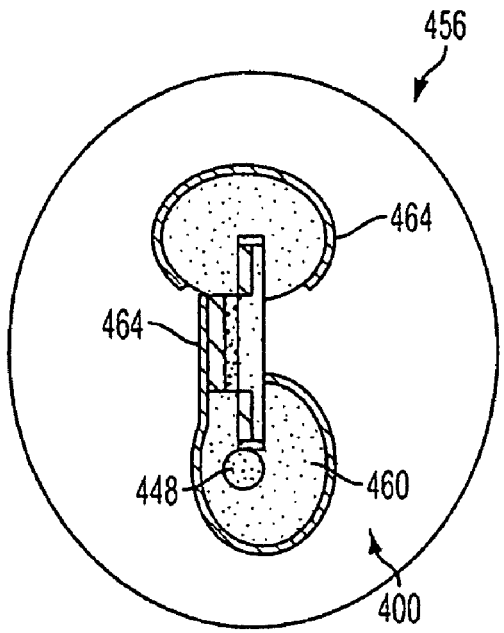
Figure 4W:
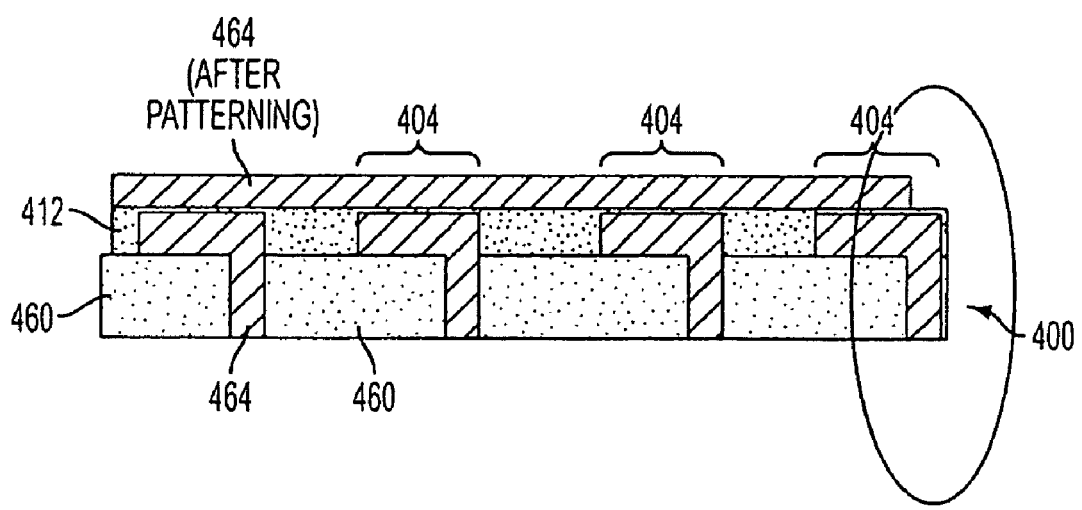

Referring now to FIG. 5, and also to FIGS. 4A-W, at step 505 a single crystal silicon wafer 408 of a desired crystal orientation is provided (FIG. 4A). As discussed above relative to the semiconductor substrate discussed above in connection with FIGS. 1-3, other semiconductor compositions may be utilized. A representative list of such compositions is found on pages 19-20 of the '795 application. In this example, the wafer 408 is ground and polished on both sides and may be doped or undoped. At step 510, an insulator layer of silicon dioxide 412 (FIG. 4B) is grown on top of the polished surface of silicon wafer 408. The silicon dioxide layer 412 may be grown by wet or dry thermal oxidation and will form the gate insulator in the finished FETs 404 (FIG. 4W). Alternatively, other insulator layers may be preferentially deposited on top of silicon wafer 408. Material compositions for such alternative insulators are detailed on pages 26-28 of the '795 application.

At step 515, a metal layer 416 (FIG. 4C) is deposited on top of gate insulator layer 412 from step 510 above. This metal layer 416 will form the gate metal layer in the finished FETs 404 (FIG. 4W). Material compositions for representative metal layers are detailed on page 21 of the '795 application. Following this, at step 520 a photoresist layer 420 is deposited on silicon wafer 408 on top of metal layer 416 (FIG. 4D). At step 525, photoresist layer 420 is exposed, developed and patterned with the desired pattern (FIG. 4E). Techniques for photoresist patterning, composition and photolithography are detailed on pages 21-25 of the '795 application.

At step 530, the exposed sections of metal layer 416 from step 525 are etched to reveal the underlying gate insulator layer 412 (FIG. 4F). At step 535, the exposed sections of gate insulator layer 412 from step 530 are etched to reveal the regions 424 of the underlying silicon surface of wafer 408 (FIG. 4G). Furthermore, any remaining photoresist 420 is now removed. Techniques for etching the coating layers and the wafer materials are detailed on pages 25-26 of the '795 application. At step 540, active dopants 428 (FIG. 4H) are implanted and activated into revealed regions 424 from step 535 above. These dopants 428 will form the ohmic contact to the source/drain electrode in the finished FETs 404 (FIG. 4W). Typical dopants and their deposition techniques have been elaborated on pages 19-20 of the '795 application.

At step 545, a photoresist layer 432 is deposited on top of metal layer 416 (FIG. 4I). At step 550, the photoresist layer 432 is exposed, developed and patterned with the desired pattern (FIG. 4J). At step 555, the exposed sections of the metal layer 416 from step 550 are etched to reveal the underlying gate insulator layer 412 (FIG. 4K). At step 560, the exposed sections of the gate insulator layer 412 from step 555 are etched to reveal the underlying silicon surface regions 436 (FIG. 4L). Ideally the patterns are aligned such that the newly revealed silicon surface regions 436 is in close/intimate contact with the adjacent dopant layer 428.

At step 565, silicon wafer 408 is partially etched into at revealed surface regions 436, creating corresponding respective cavities 440 (FIG. 4M). The depth of each cavity 440 may be from less than a micron to several hundred microns. At step 570, a metal layer 444 is deposited such that it coats the insides of cavities 440 (FIG. 4N) and is in intimate contact with dopant layer 428. FIG. 4O depicts a top view of silicon wafer 408 at this time. Furthermore, any remaining resist 432 is now removed. At step 575, one or more conductive wires (or ribbon(s) or other preexisting elongate conductor(s)) 448 are introduced into metal coated cavities 440 and bonded to metallic layer 444 (FIG. 4P). Exemplary compositions for the elongate conductor(s), and bonding techniques, are revealed on pages 28-32 of the '795 application. Conductive wire(s) 448 will serve the function of the source electrode/data bus line of the finished FETs 404 (FIG. 4W). In this example, conductive wire 448 is bonded only on one side of each field effect transistor 404, in this example the source side (FIG. 4Q).

At step 580, silicon wafer 408 is thinned from the back side to liberate conductive wires 448 along with the bonded silicon dice 452 (FIG. 4R) to form free composite members 456. (It is noted that the unfilled ovals appearing in FIG. 4R (and FIGS. 4V, 4W, 6B, 11A, 12, 13A-C and 15A-C are abstractions indicating the presence of a strand of partially or fully completed active electronic devices. As those skilled in the art will appreciate, the shape of each such oval generally indicates the direction of the longitudinal axis of that strand.) At the same time silicon wafer 408 is thinned to liberate composite members 456 from the original wafer, if desired this thinning can also be used, for example, in conjunction with channels or other depressions formed in the obverse side of the wafer, to remove material between adjacent ones of the partially completed FETs 404 along the lengths of the composite members. FIG. 4S details functional elements of one such representative composite member 456. Typical semiconductor wafers are of finite diameters, typically less than 12 inches. However, in applications wherein longer FETs strands may be required, such as large-area displays, an optional step 585 may be introduced, wherein step 505 thru step 580 may be repeated multiple times along the length of a large substrate, so as to create long, continuous or substantially continuous composite members.

At step 590, an insulator layer 460 (FIG. 4T) is deposited on composite member 456. Insulator layer 460 is deposited selectively, such that the insulator layer covers the metallic wire 448 (source electrode), the ohmic contact regions and the free metallized end of silicon die 452. For example, selective deposition techniques such as electro-deposition, electroplating, and electrophoretic may be utilized. Exemplary material compositions for insulator coatings for forming insulator layer 460 are detailed on pages 26-28 of the '795 application. At step 595, a metal layer 464 (FIG. 4U) is conformally deposited on composite structure 456. Metal layer 464 will form the gate metal layer of the finished FET devices 404 of FIG. 4W.

At step 599, metal layer 464 is patterned as desired. FIG. 4V and FIG. 4W are transverse and longitudinal views of such patterning respectively. At this point, AED strand 400 may be considered finished and ready for use in creating an electrical component, for example, as described below in connection with FIGS. 6A-E and 7.

Figure 6A:
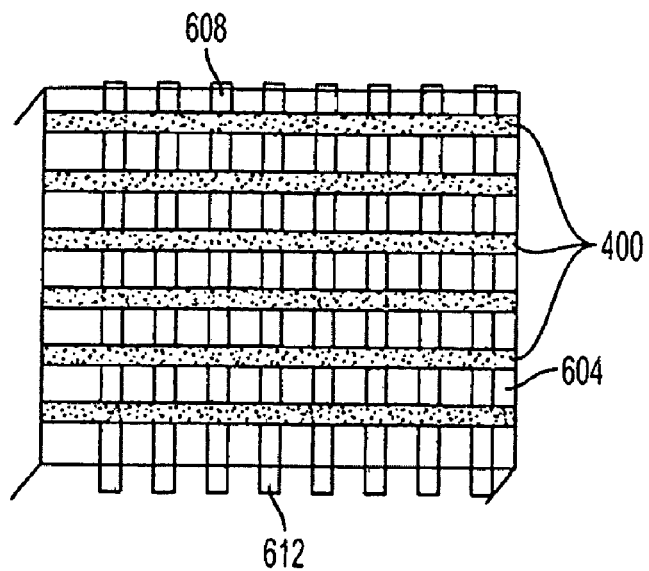
FIG. 6A is a plan view of a substrate for making an electronic component (FIG. 6E) that utilizes the transistor strand of FIG. 4W.
Figure 6B:
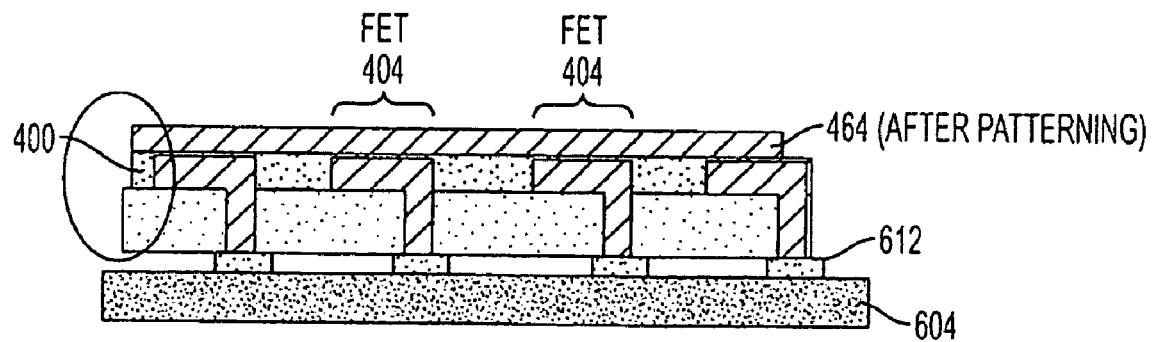
FIGS. 6 B-E are cross-sectional views of the electronic component at various stages of manufacture.
Figure 6C:
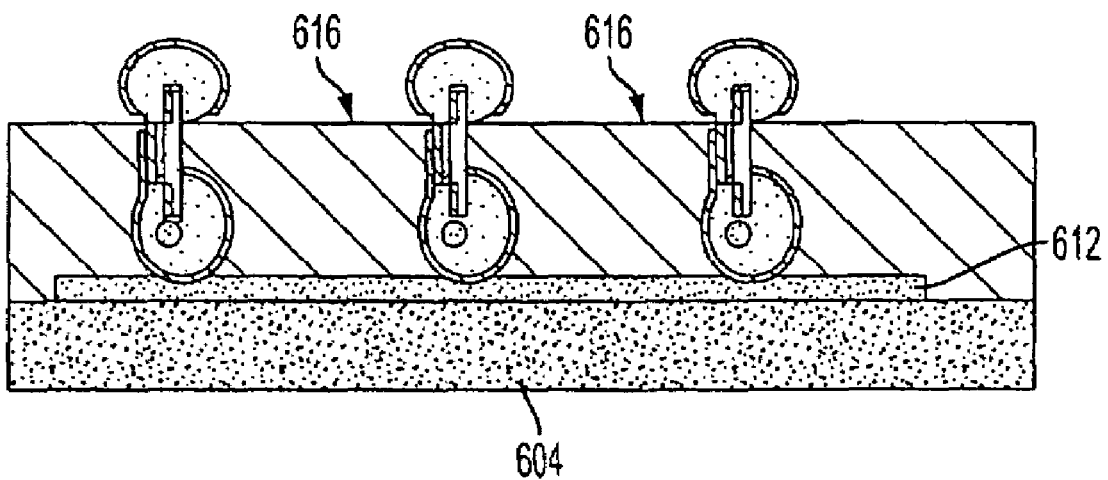
Figure 6D:
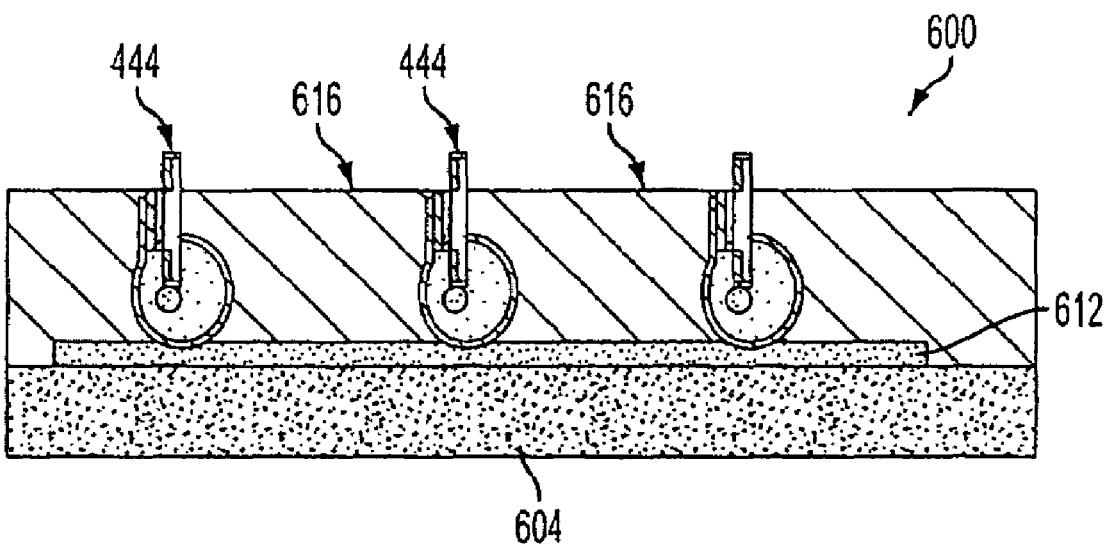
Figure 6E:
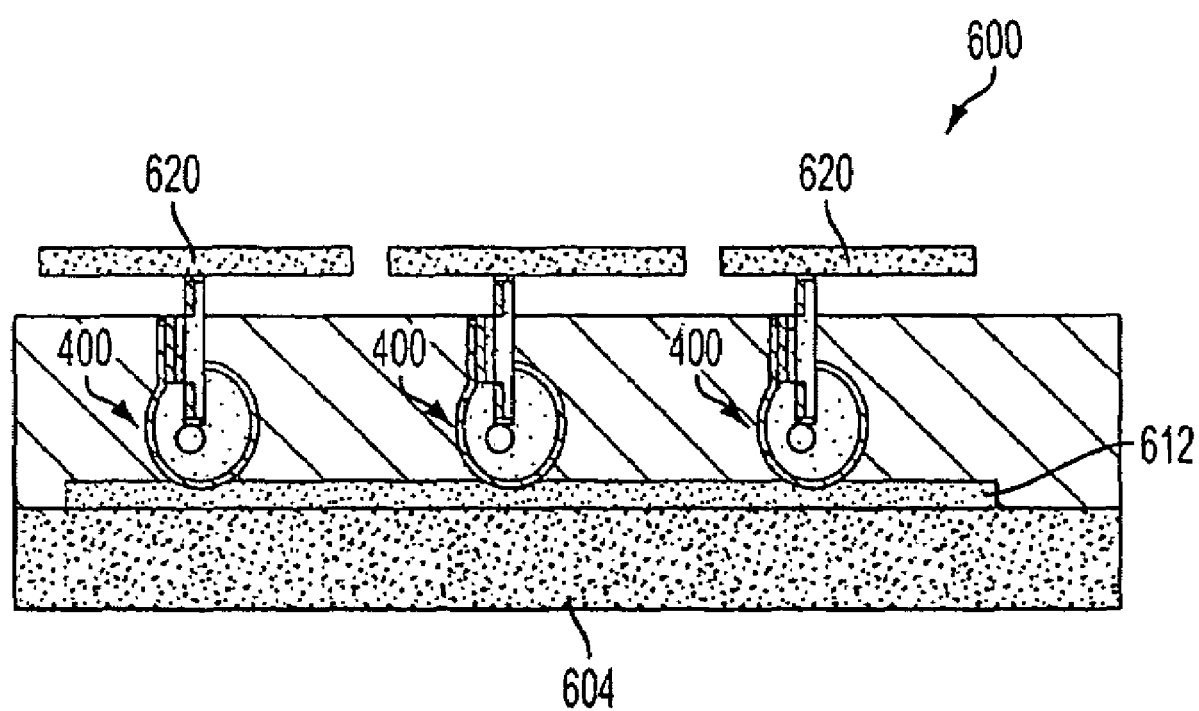
Figure 7:
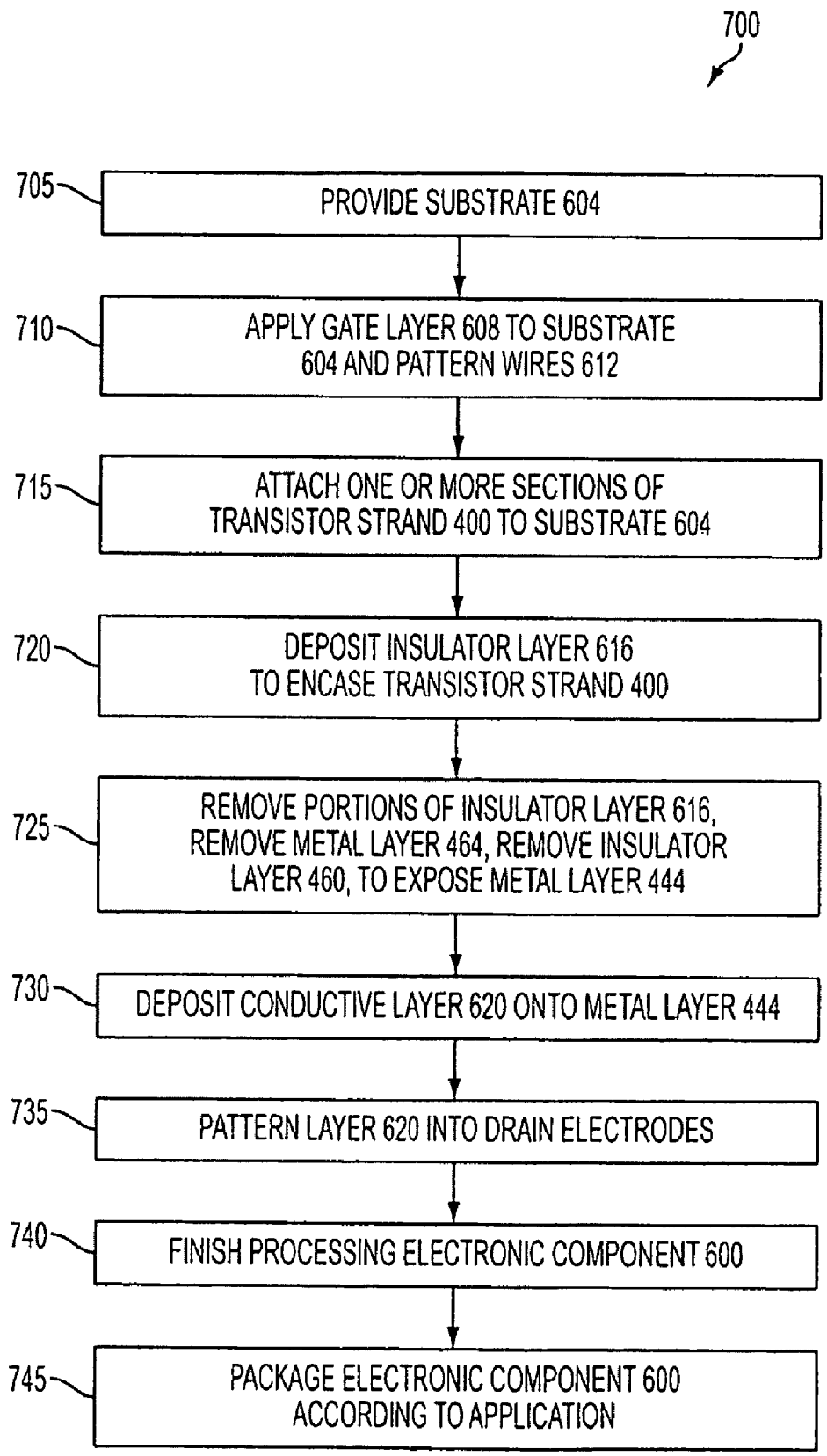
FIG. 7 is a flow diagram illustrating a method of utilizing the transistor strand of FIG. 4W to make the electronic component of FIG. 6E.

Referring now to FIGS. 6A-E, and also to FIG. 7, FIG. 6E shows a partially finished electronic component 600 made, for example, by affixing one or more transistor strands 400 of FIG. 4W to a substrate 604. Substrate 604 may be, for example, any suitable one of the substrates described on pages 35-38 of the '795 application. FIG. 7 illustrates a method 700 that may be used to form electronic component 600 of FIG. 6E. Referring to FIG. 6A, at step 705, substrate 604 is provided. At step 710, a gate layer 608 comprising a series of patterned conductive wires 612 is applied to substrate 604. Wires 612 may, but need not necessarily, be parallel to one another and extend in the same direction, which may be orthogonal to the direction of the longitudinal axes of transistor strands 400 (FIGS. 6B-E) to be attached to substrate 604. The spacing between adjacent ones of wires 612 is as needed to suit a particular application. Wires 612 may be formed of any suitable conductive material, for example, the metals listed on page 21 of the '795 application and may be patterned, like any of the layers of transistor strand 400, using, for example, any suitable one(s) of the patterning and etching techniques described on pages 21-25 of the '795 application.

At step 715, one or more sections of transistor strand 400 and/or one or more entire strands are attached to substrate 604 as illustrated in FIG. 6B so that the patterned wires 612 are in electrical contact with patterned conductive layers 464 of the various FETs 404 on the transistor strand. It is noted that each transistor strand 400 may be cut to the appropriate length after or before being affixed to substrate 604. Bonding of conductive layers 464 to patterned wires 612 of substrate 604 may be accomplished using any suitable technique, such as any of the techniques listed on page 32 of the '795 application. After bonding, at step 720 an insulating layer 616 (FIG. 6C) may be deposited to encase transistor strand(s) 400, or portions thereof, and fill the space between the strands/portions. The material of insulating layer 616 may be organic or inorganic in composition and may be photosensitive, if desired. Insulating layer 616 may also serve to planarize the free surface of the assembly. Representative planarization layer material compositions are detailed on page 34 of the '795 application.

After depositing insulating layer 616, at step 725 a portion of this insulating layer is etched or otherwise removed to reveal metal layer 464, which is also etched or otherwise removed to reveal insulator layer 460 that, in turn, is etched away or removed to reveal metal layer 444 of transistor strands 400. FIG. 6D illustrates electronic component 600 after the material etching/removal of step 725. At step 730, a conductive layer 620 (FIG. 6E) is deposited on the exposed metal layer 444 using any of a number of deposition techniques, such as techniques describe in the '795 application. Conductive layer 620 will provide FETs 404 with drain electrodes after patterning in step 735. At step 740, electronic component 600 may be processed further to include any additional devices and structures (not shown) needed, for example, capacitors, resistors, metal interconnects, etc. Then, at step 745, the finished electronic component 600 may be packaged with other components, for example, a driver to drive the back plane of a display, display front panels, such as organic LEDs, liquid crystals, etc., as dictated by the application at hand.

Figure 8A:
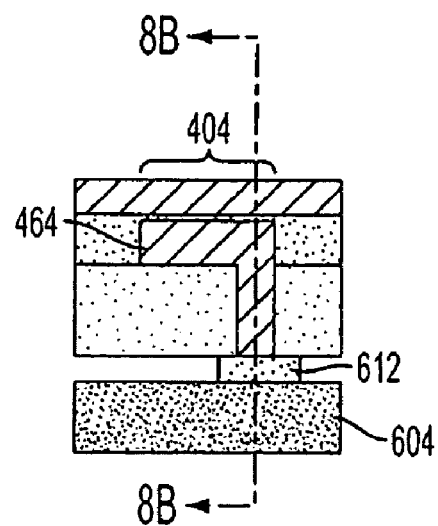
FIG. 8A is an idealized side view of one of the transistors of FIG. 4W.
Figure 8B:
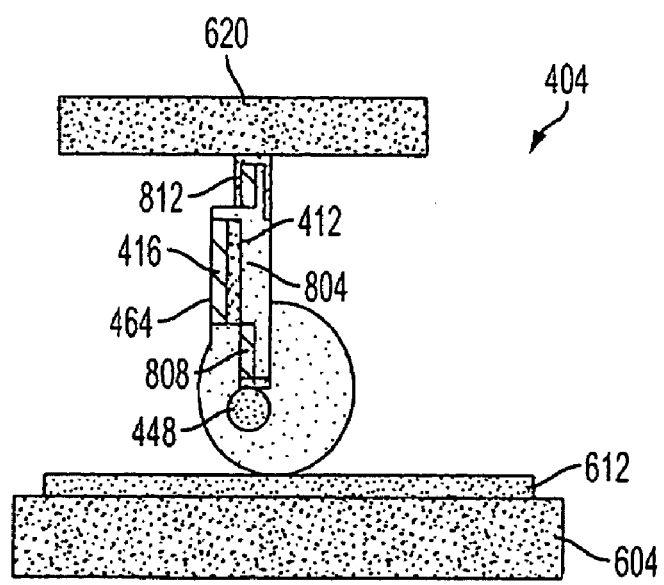
FIG. 8B is an idealized transverse cross-sectional view as taken along line 8B-8B of FIG. 8A.

To help visualize the functional structure of FETs 404 on transistor strand 400, FIGS. 8A-B show an idealistic representation of any one of these FETs in the context of electronic component 600 of FIG. 6E. As seen in FIG. 8B, conductive wire 448 functions as the source of FET 404, and conductive layer 620 (e.g., a pixel electrode) of electronic component 600 functions as the drain of the FET. Silicon semiconductor surface 804 function(s) as the channel of FET 404 between the source 808 and drain 812. Insulator layer 412 atop silicon surface 804 (i.e., the channel) function to insulate the channel from the gate electrode of FET 404, which is provided by patterned conductive layer 464 and layer 416. As is readily seen in FIG. 8B, wire 612 on substrate 604 is in electrical communication with the gate electrode (conductive layer 464) for controlling the gating of the channel (i.e., silicon layer at/near surface 804). Some of the more salient features of the foregoing methodologies are described on page 65 of the '795 application.

In the foregoing embodiment, specific examples of process methodologies have been shown. However, as has been fairly extensively catalogued on pages 40-51 in the '671 application, there are a variety of permutations and combinations that may be substituted to create the same net effect. Once familiar with the basic teachings of the present disclosure, those skilled in the art will readily appreciate how to embody and execute these permutations and combinations to achieve desired results.

Figure 9:
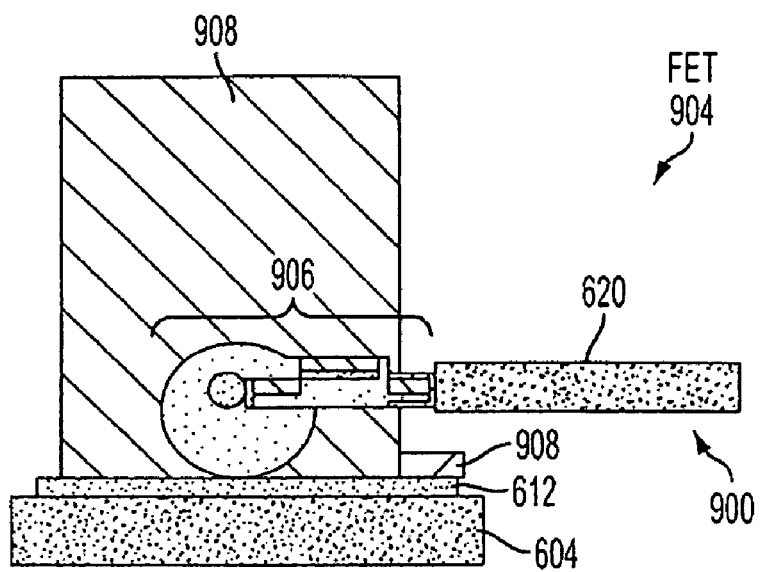
FIG. 9 is an idealized cross-sectional view of a transistor made in accordance with the present disclosure in which the transistor is rotated 90° relative to other embodiments disclosed.

In the embodiment discussed above, the drain/pixel electrodes (i.e., conductive layer 620) are on the upper surface (relative to the orientation of FIG. 8B). However, in alternative embodiments the transistor strands can be effectively rotated 90° relative to the substrates so that the drain/pixel electrodes, the source/data bus lines and the gate/gate bus lines can be nearly co-planar. This would make the FETs look more like thin-film transistors in conventional arrays. FIG. 9 shows an idealistic representation of a transistor strand 900 having an FET 904 made in accordance with the broad concepts of method 700, but with some differing steps. One way to achieve the structure shown in FIG. 9 is to modify the steps of method 700 of FIG. 7 as follows. At a step corresponding to step 715, transistor strand 900 is oriented so that the silicon member 906 (i.e., portion of the original precursor substrate) extends sideways (i.e., parallel to substrate 604) and secured to gate bus line 612 on substrate 604 using any of a number of metal joining techniques. As before, gate bus line 612 is one of a plurality of parallel lines patterned on substrate 604. At a step corresponding to step 720, insulator structures 908 may be formed by depositing an insulator layer so as to preferentially encase transistor strand 900 and gate bus line 612. The insulator material for this step may be organic or inorganic in composition. In addition, it may be photosensitive, if desired. This layer can also serve to planarize the top surface. After forming insulator structures 908, steps equivalent to steps 725 onward may be performed to complete a corresponding electronic component.

Figure 10:
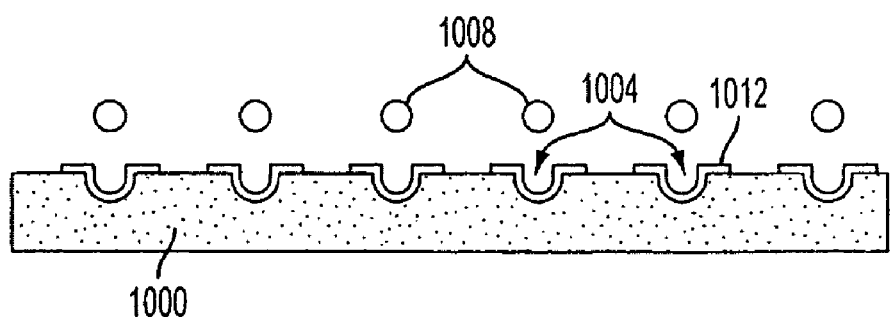
FIG. 10 is an elevational cross-sectional view of a pre-grooved substrate suitable for use with any of a number of the electronic device strands of the present disclosure.

In the preceding examples, substrates 300, 604 (FIGS. 3 and 6A-E) illustrated are shown having substantially flat upper surfaces that confront the corresponding respective AED strands 212, 400. However, and referring to FIG. 10, each of these substrates 300, 604 may be replaced by, for example, a substrate 1000 that includes one or more grooves 1004 or other depressions/channels for receiving AED strands 1008 or portions thereof to aid in arranging the AED strands, or electronic devices thereon, on the substrate relative to one another and/or to other devices. If AED strands 1008 are of the type having a conductive outer layer (not shown), such as for the gate electrodes, and substrate 1000 is provided with grooves 1004 rather than dimples or other depressions, the substrate may be provided with gate bus lines 1012 that, at least locally, have current flow axes that extend perpendicular to the longitudinal axes of grooves 1004. Those skilled in the art will appreciate the variety of substrates and depressions that may be used to aid in aligning AED strands and/or their component electronic devices, for example, FETs.

Referring back to FIG. 8B, this figure illustrates a FET 404 applied to a substrate 604 so that the silicon semiconductor members 452 are oriented vertically relative to FIG. 8B. In that example, conductive layer 464, i.e., gate electrode, extends largely around the circumference of FET 404 from a gate bus wire 612 on substrate. It is noted that the gate electrode need not be arranged in this manner. Rather, the gate electrode may be provided after the transistor strand is applied to a substrate.

Figure 11A:
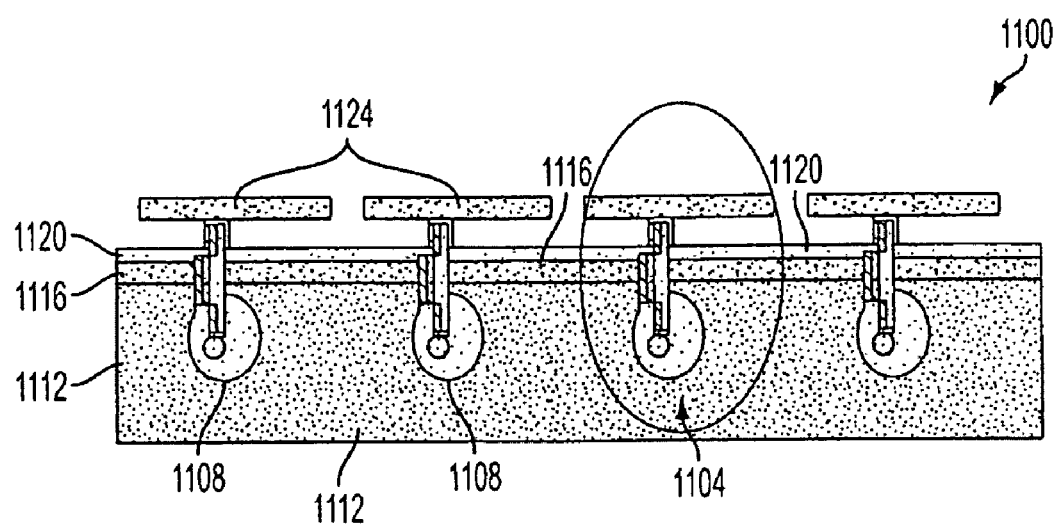
FIG. 11A is an elevational cross-sectional view of an alternative electronic component that includes transistors having their gate electrodes formed after the transistor strands have been attached to a substrate.
Figure 11B:
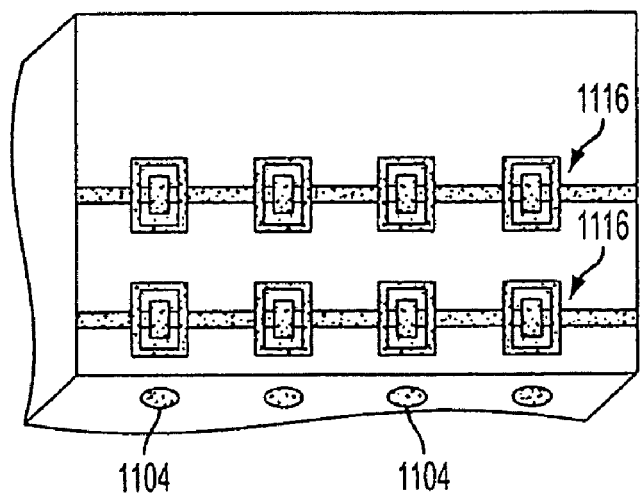
FIG. 11B is a reduced plan/perspective view of the electronic component of FIG. 11A.

For example, FIG. 11A shows a partially completed electronic component 1100 having four identical transistor strands 1104 (or portions of the same strand or differing strands) comprising corresponding respective FETs 1108. As discussed above, a gate electrode layer, for example, conductive layer 464 of FIG. 4U, is provided to transistor strand 400 (FIG. 4W) before the strand is attached to a substrate. However, in FIGS. 11A-B, transistor strands 1104 (FIG. 4T) are embedded in a composite substrate 1112 prior to any gate electrode layer being applied thereto. After transistor strands 1104 have been embedded in composite substrate 1112, a gate electrode layer 1116 is deposited on the substrate and patterned, for example, as shown in FIG. 11B. Then, an insulating layer 1120 (FIG. 11A) is deposited and patterned on gate electrode layer 1116. After insulating layer 1120 has been provided, drain/pixel electrode layer 1124 may be deposited and patterned. Insulating layer 1120, provides electrical insulation between gate electrode layer 1116 and drain/pixel electrode layer 1124 so as to inhibit shorting there between.

Figure 12:
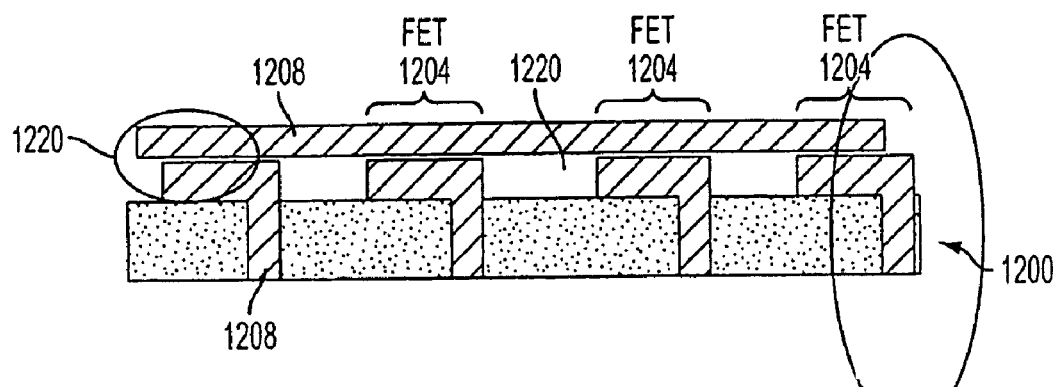
FIG. 12 is a longitudinal cross-sectional view of an alternative AED strand made in accordance with the present disclosure.

Referring again to FIG. 4W, this figure depicts a longitudinal view of AED strand 400, which comprises a plurality of FET elements 404. The underlying silicon member 452 (not shown in FIG. 4W, but shown in FIG. 4R, for example) is substantially continuous in that embodiment. FIG. 12 depicts a longitudinal view of an alternative AED strand 1200, which includes a plurality of FET elements 1204. In this case, silicon member 1220 is patterned along with the gate metal layer 1208 to reduce the overlap between the source/drain and gate layers, thereby reducing circuit capacitance and also in making AED strand 1200 more flexible.

Figure 13A:
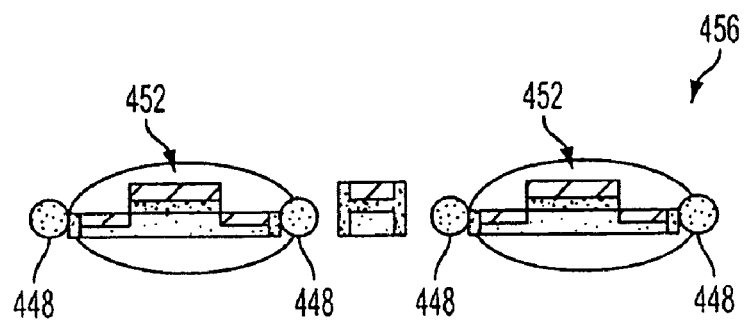
FIGS. 13A-C are cross-sectional views illustrating an alternative method of manufacturing ADD strands that increases yields.
Figure 13B:
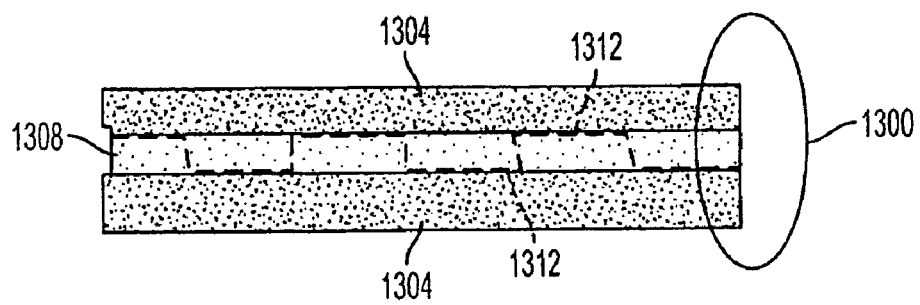
Figure 13C:
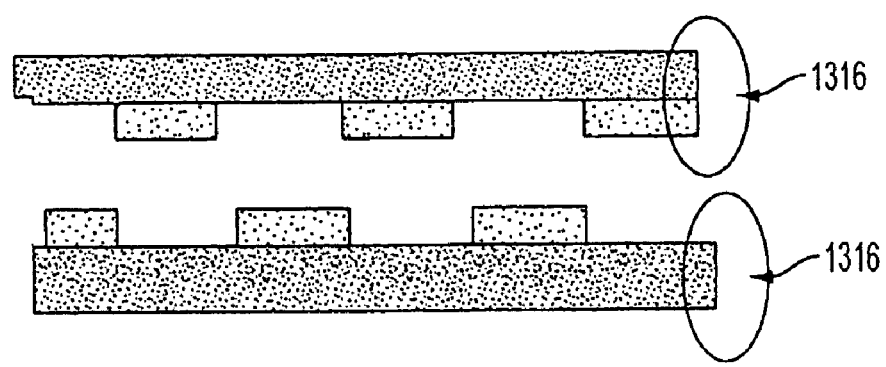

Referring to FIG. 4Q, conductive wire 448 is bonded only on one side of the field effect transistor. Alternatively, to increase net FET element 404 (FIG. 4W) yields per starting wafer 408 (FIG. 4A), conductive wire 448 could be bonded on both sides of the field effect transistor. Referring to FIG. 4R and step 580, composite silicon member 456 will be modified as depicted in FIG. 13A, upon conductive wire 448 being bonded on either sides of the FET. Referring now to FIG. 13B-C, FIG. 13B depicts a longitudinal view of the alternative composite silicon-member 1300. Conductive wires 1304 (again, the term "wire" is intended to cover wire, wire-like structures and other elongate conductors) are laminated on both sides of a silicon member 1308, which may be, for example, one of the silicon members 452 of FIG. 4R. Silicon member 1308 is then cut into sections, as depicted by representative cutting pattern 1312 to yield two sets of silicon-member-plus-wire 1316 as depicted in FIG. 13B. Those skilled in the art will readily appreciate that cutting pattern 1312 could be readily modified to create a multitude of geometries while yielding two silicon-member-plus-wire composites 1316.

Figure 14A:
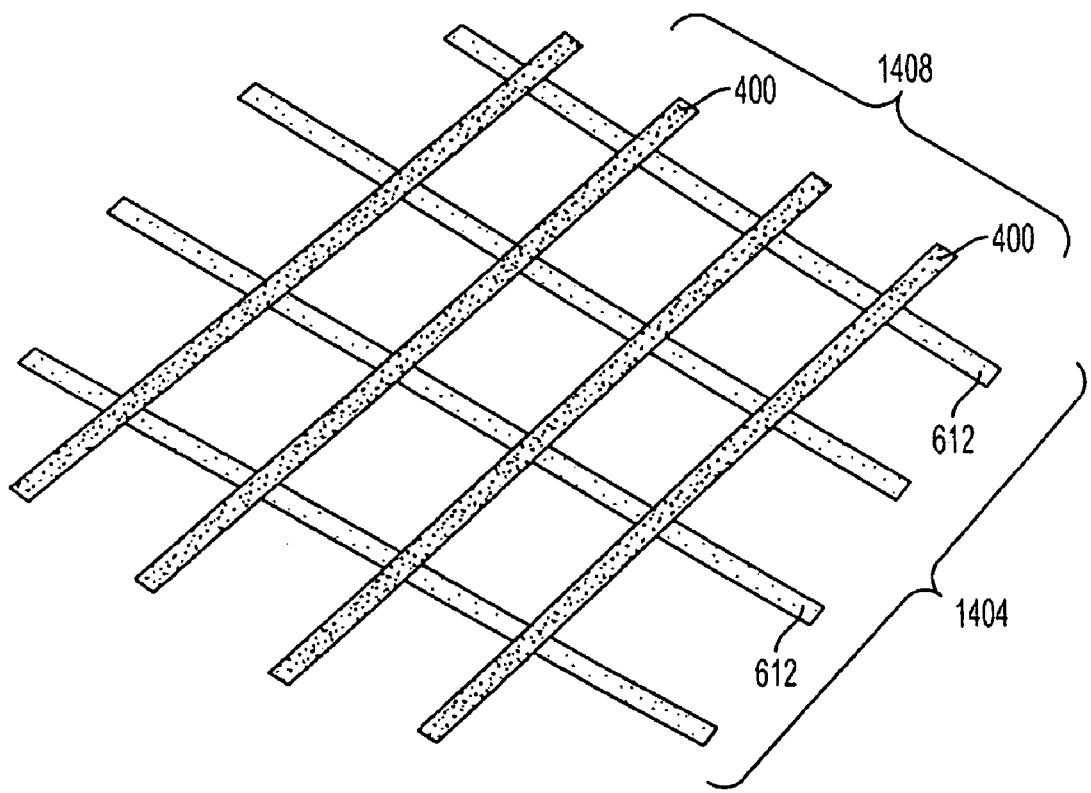
FIGS. 14A and 14B are perspective high-level schematic diagrams illustrating a plurality of AED strands in, respectively, a non-woven configuration and a woven configuration.
Figure 14B:
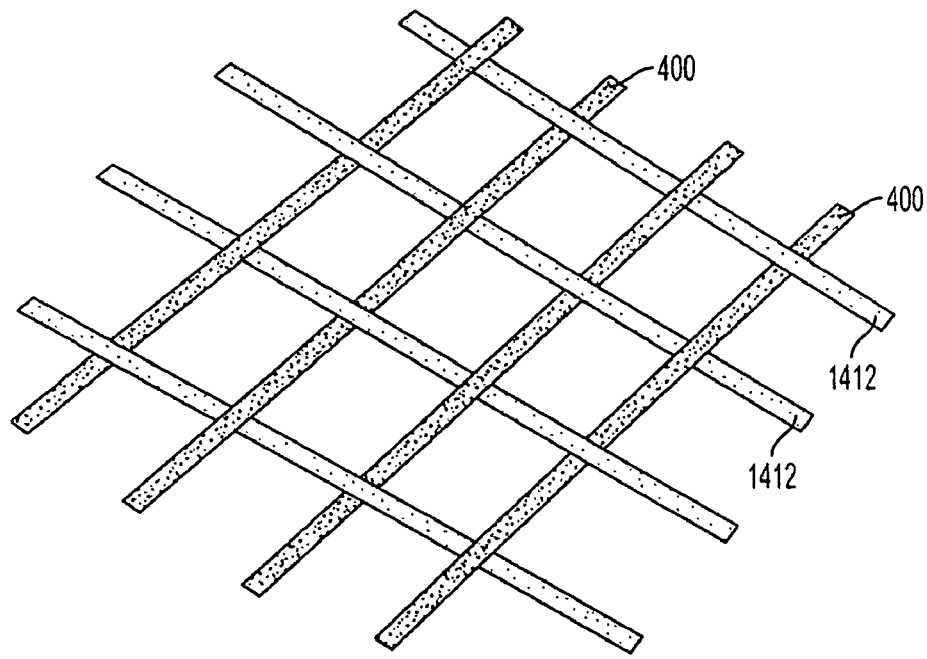

Referring again to FIG. 6A and FIG. 7, step 710 of FIG. 7 includes applying a gate metal layer 608 to substrate 604 and then patterning layer 608 into wires 612. At step 715 one or more sections of AED strand 400 are attached to substrate 604 such that metal layer 464 on AED strand 400 is in electrical communication with wires 612 (FIG. 6B). Referring now to FIGS. 14A-B, FIG. 14A is essentially a reproduction of FIG. 6A but depicting only the patterned wires 612 (FIG. 6B) and AED strands 400. As seen in FIG. 14A, patterned wires 612 may lie in one plane 1404 and AED strands 400 may lie in another plane 1408 that overlies plane 1404. This type of physical arrangement may also be thought of as a "non-woven" arrangement. In some embodiments, patterned wires 612 may be replaced by discrete conductors so as to form a non-woven fabric free of a permanent substrate. FIG. 14B, on the other hand, illustrates a woven arrangement of AED strands 400 and conductors 1412 that, in this example, pass over one AED strand and then pass under the next AED strand in a simple woven manner. Those skilled in the art will readily appreciate that other weaving arrangements and patterns may be used to suit a particular design.

Figure 15A:
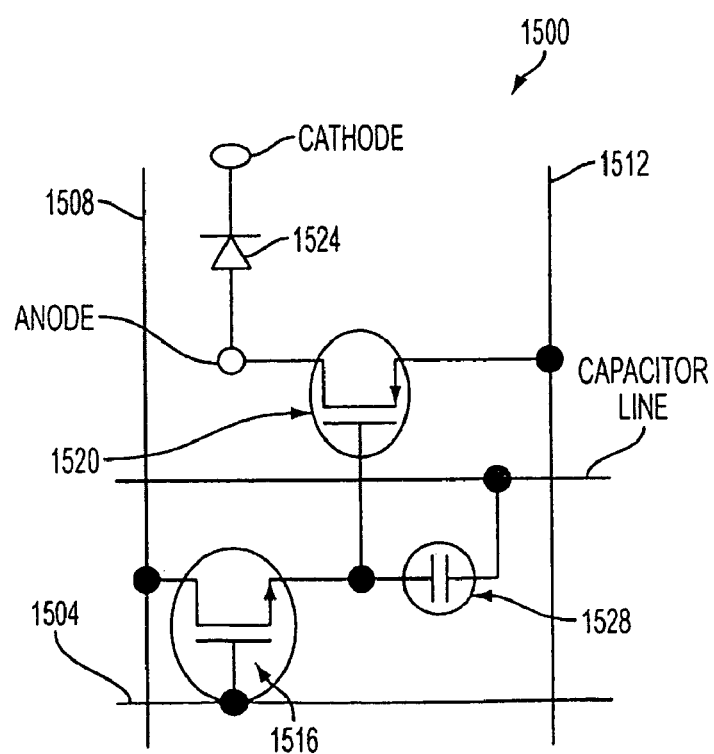
FIG. 15A is a representative schematic diagram of a circuit layout for driving an OLED display.
Figure 15B:
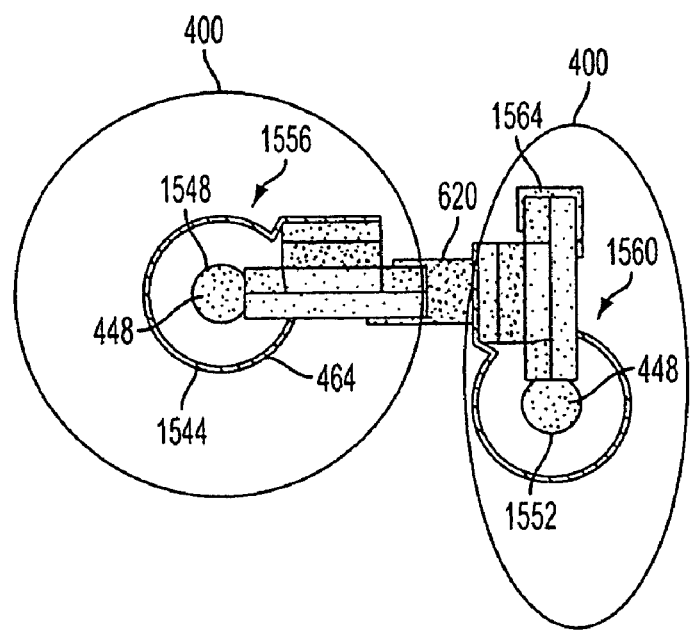
FIGS. 15 B-C are each a transverse cross-sectional view of a pair of AED strands of FIG. 4W assembled together to partially create a circuit similar to the circuit of FIG. 15A.
Figure 15C:
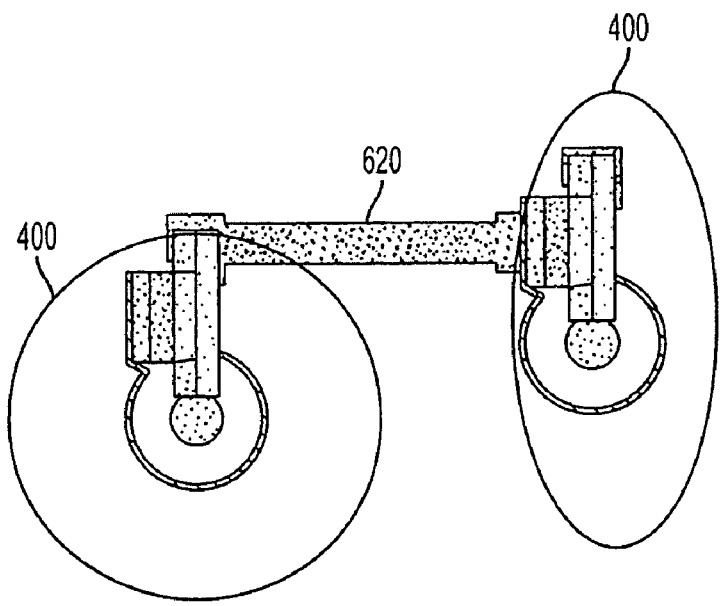

Referring now to FIG. 15A-C, FIG. 15A depicts a typical pixel layout of a pixel element 1500 of an electronic backplane required to drive a current-driven front plane display technology, such as an organic light emitting diode (OLED) or polymer organic light emitting diode (POLED), etc., technology. In this case, each display pixel is driven by two transistor elements 1516, 1520 of, for example, the PMOS/NMOS/CMOS variety. Transistor element 1516 works as the switch, activating when an input signal is fed into a scan line 1504, and corresponding input signal is fed into a signal line 1508. Transistor 1520 controls the current passing through to the light emitting diode 1524 when a corresponding signal is fed into supply line 1512. Notably, the drain of TFT 1516 is connected to each of the gate of TFT 1520 and a storage capacitor 1528.

Referring now to FIGS. 4W, 15A and 15B, FIG. 15B depicts how a circuit similar to the circuit of pixel element 1500 of FIG. 15A can be realized by using FETs 404 on two AED strands 400 (FIG. 4W) or, alternatively, on two separate portions of a single original AED strand. FET 404 on one AED strand 400 forms a first transistor element 1556, which acts as a switch. Conductive wire 448 of this AED strand 400 forms the signal line 1548, and metal layer 464 forms the scan line 1544. Similarly, FET 404 of the other AED strand 400 forms a second transistor element 1560 that acts as a driving FET. Conductive wire 448 of this second AED strand 400 forms a supply line 1552. The drain of transistor element 1556 is in electrical communication with the gate of transistor element 1560 via conductive drain layer 620, which is also seen, e.g., in FIGS. 8B and 9. The drain 1564 of transistor element 1560 can be further connected (not shown) to an anode of an OLED, etc. FIG. 15 C illustrates a variant of the arrangement shown in FIG. 15B, wherein the FETs on both AED strands 400 are vertical in orientation, and the drain of the switching FET is electrically connected to the gate of the driving FET via conductive drain layer 620 that extends perpendicular to layering of the silicon dice. It will be readily apparent to those skilled in the art that additional components, like capacitors, can be readily integrated.

Figure 5A:
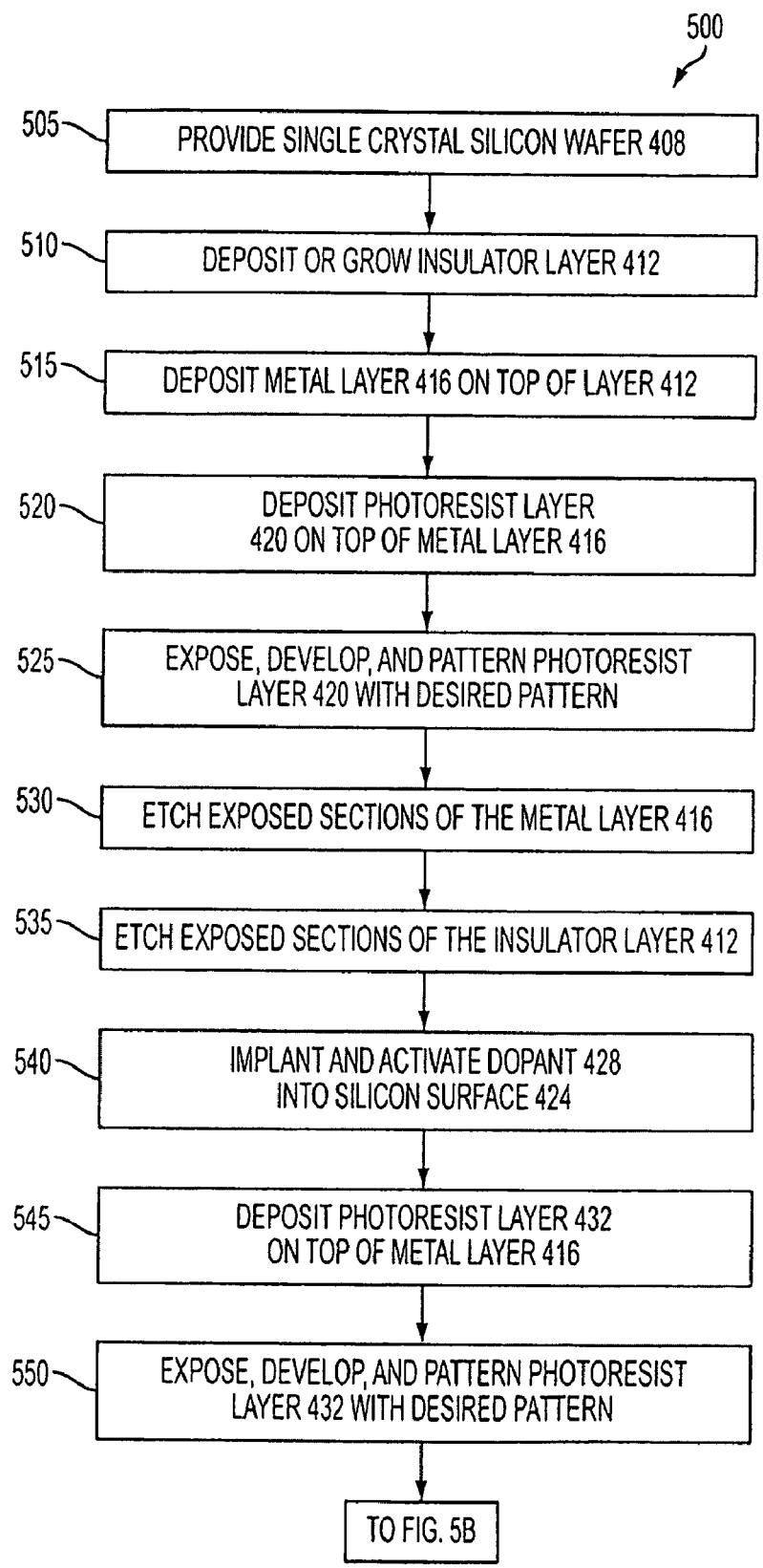
FIGS. 5A-B contain a flow diagram illustrating a method that may be used to make the transistor strand of FIG. 4W.
Figure 5B:
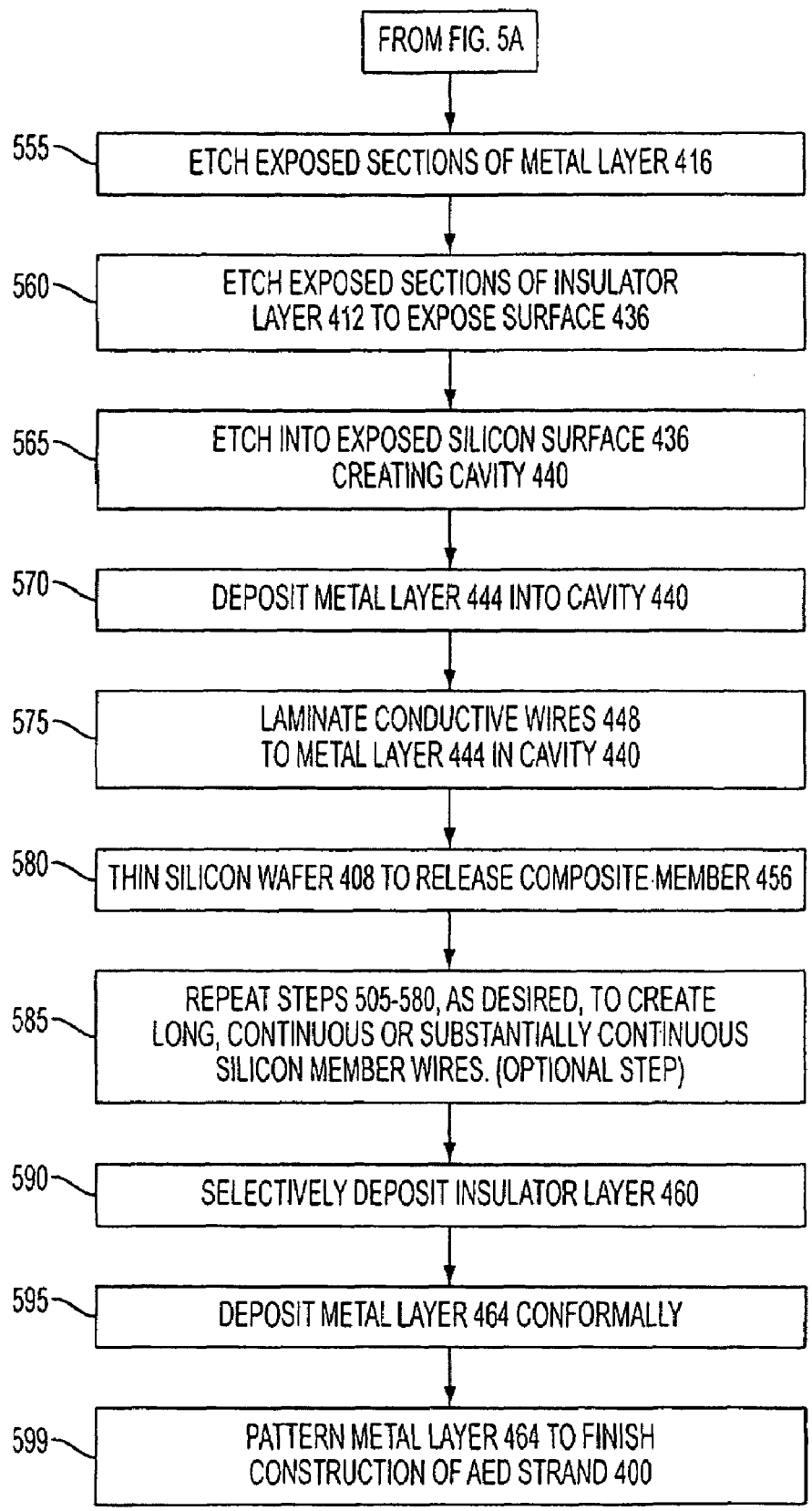
Figure 16:
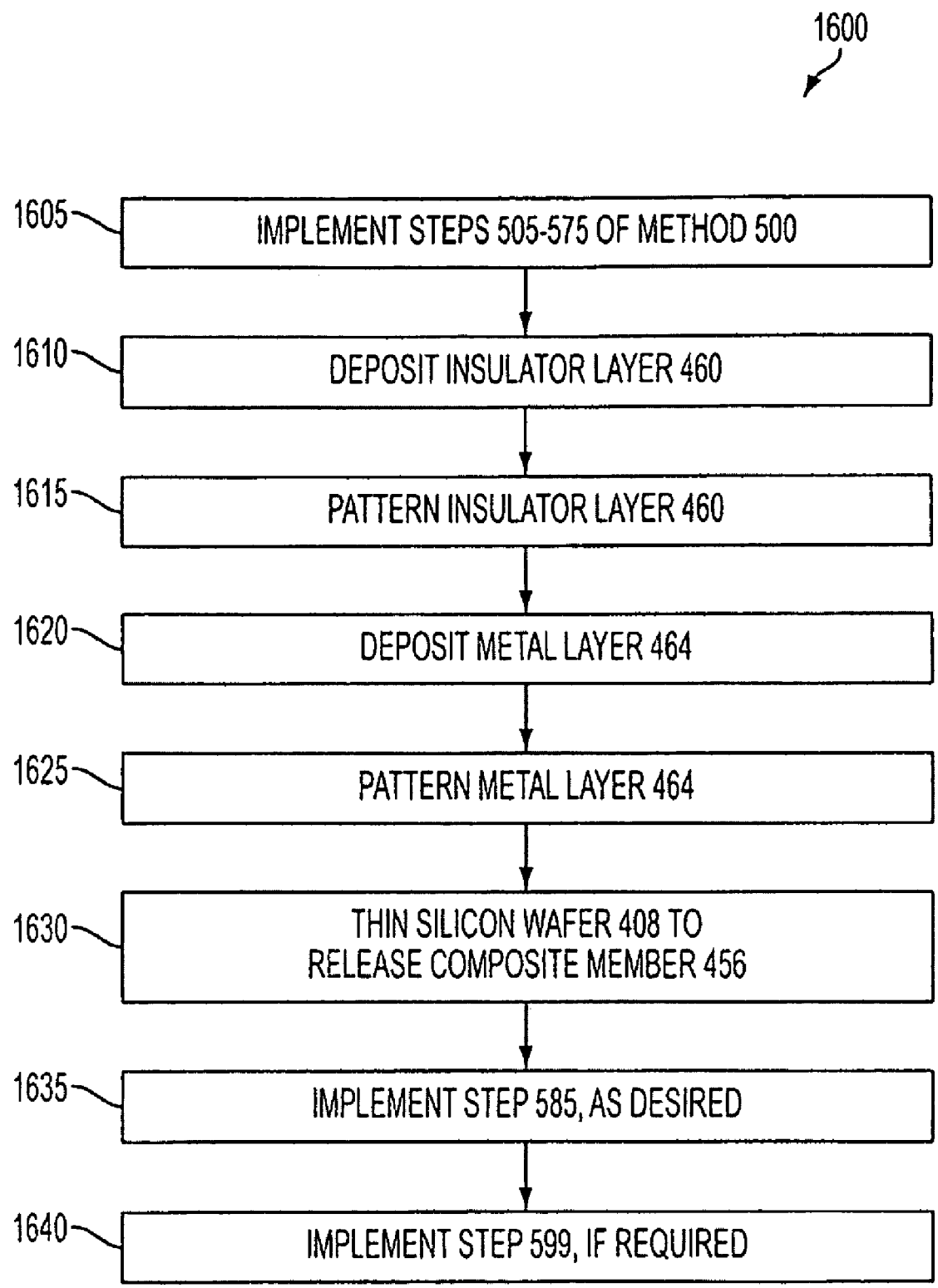
FIG. 16 is a flow diagram illustrating an alternative method of making an AED strand using in lieu of method of FIG. 5.

In the foregoing embodiment depicted in flow chart 500 of FIGS. 5A-B, step 580 includes thinning the silicon wafer 408 from the back side to release conductive wires (or ribbons) 448 along with the bonded silicon dice 452 (FIG. 4R) to form composite member 456. In another embodiment, this wafer thinning step may be deferred until later. Referring now to FIG. 5 and FIG. 16, FIG. 16 depicts a modified manufacturing method 1600 that incorporates the deferred step. As is evident from FIG. 16, step 1605 includes implementing steps 505-575 of method 500 (FIG. 5). The result is shown in FIG. 4Q.

Then, at step 1610 an insulator layer (equivalent to insulator layer 460 of FIG. 4T, but applied over the earlier deposited layers 412, 416, etc.) is deposited on top of silicon wafer 408. At step 1615, the insulator layer is patterned as needed. At step 1620, a metal layer (equivalent to metal layer 464 of FIG. 4U) is deposited on top of the just-patterned insulator layer. At step 1625, the just-deposited metal layer is patterned as needed. At step 1630, silicon wafer 408 is thinned from the back side to release conductive wires 448 (or other elongate conductors) along with the bonded silicon dice 452 (FIG. 4R). At step 1635, step 585 may be implemented as needed. And at step 1640, step 599 is performed.

Figure 17A:
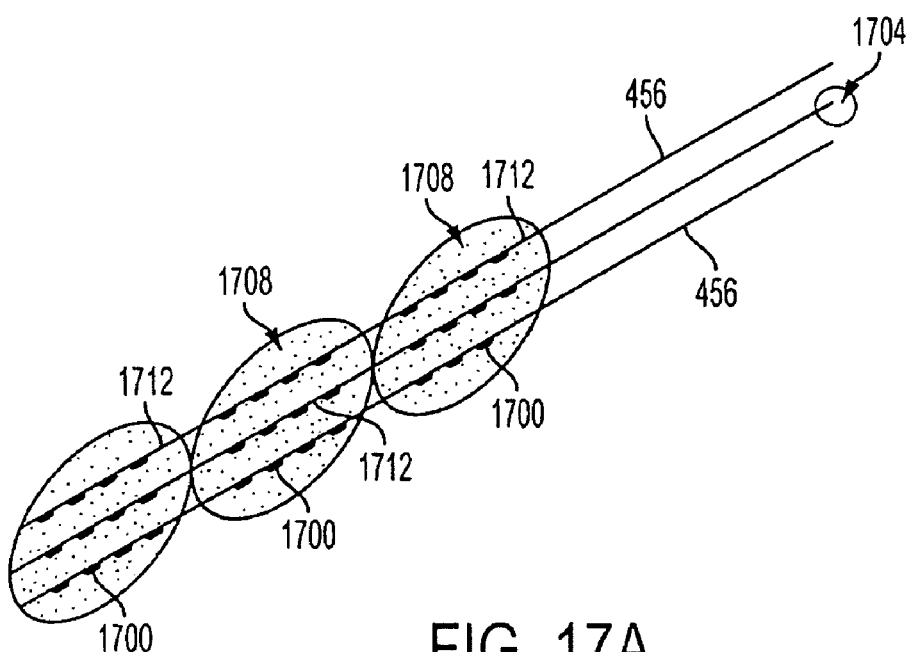
FIG. 17A is a perspective high-level schematic diagram of a continuous process that may be used to create composite members of virtually any desired lengths.
Figure 17B:
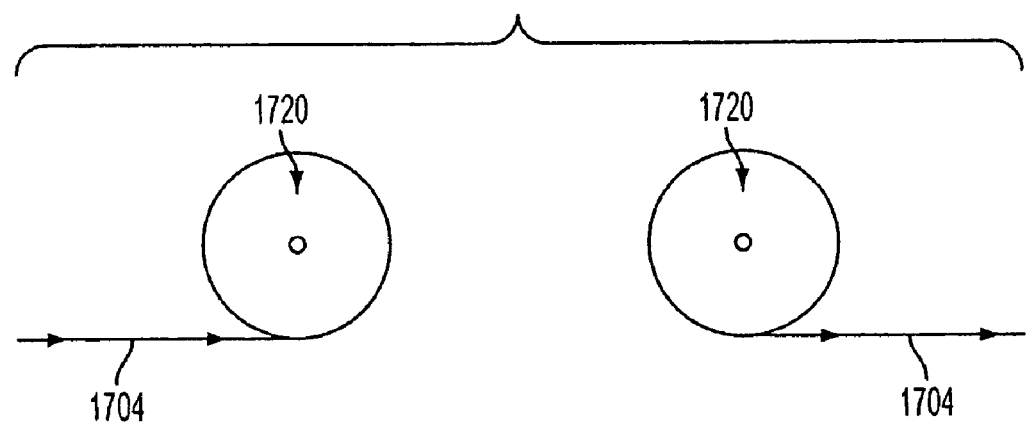
FIG. 17B is a schematic diagram of feed and take-up spools of a roll-to-roll implementation of the continuous process of FIG. 17A.

Referring to FIG. 5, and also to FIGS. 17A-B, as mentioned, step 585 of method 500 of FIG. 5 includes repeating steps 505-580 of the method so as to create long and substantially continuous composite members 456 (FIG. 4R). FIG. 17A illustrates a continuous process in which a plurality of silicon members 1700 (each of which correspond to silicon dice 452 of FIG. 4R) may indeed be formed into such long wire composites 1704. In this example, precursor structures 1708 each containing a plurality of silicon members 1700 arc brought into proximity and then into contact with a continuous conductive wire 1712, which corresponds to conductive wire 448 of FIG. 4P. At some point during the process, silicon members 1700 are laminated to conductive wire 1712 and the members are freed from the frame (not shown) of each precursor structure 1708, and not necessarily in that order.

As shown in FIG. 17B, once liberated from precursor substrates, such as precursor structures 1708 of FIG. 17A, and further processed as desired, silicon member composite 1704 may he taken up by a spool 1720 and stored thereon until needed for further processing and/or use in another step of a process for manufacturing electronic articles that will incorporate the silicon member composite. For example, spool 1720 may be used to take up and store silicon member composite 1704. Spool 1720 may then be taken to another processing station (not shown), where silicon member composite 1704 is paid out from the spool for further use. An example of such a processing station is a station in which silicon member composite 1704 is subject to one or more deposition and/or etching steps to form active electronic devices, or portions of such devices, thereon. Another example station is one in which silicon member composite 1704, which may have already been further processed, may be secured to a permanent substrate that will become part of the finished electronic articles.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of making at least one strand of field-effect transistors (FETs), comprising:
   providing a precursor substrate;
   partially forming each of at least three FETs on said precursor substrate;
   after said partially forming each of said at least three FETs, securing an elongate conductor, which exists prior to said securing, to each of said at least three FETs so as to electrically connect said at least three FETs;
   after said securing said elongate conductor to said at least three FETs, removing portions of said precursor substrate so as to liberate a composite member from said precursor substrate, said composite member including said elongate conductor and said at least three FETs electrically connected together by said elongate conductor; and
   processing said composite member so as to form a gate electrode of each of said at least three FETs.

2. The method of claim 1, wherein said processing said composite member includes selectively depositing an insulating layer on said composite member, conformally depositing a metal gate layer over said insulating layer, and patterning said metal gate layer so as to form said gate electrode of each of said at least three FETs.

3. The method of claim 1, further comprising, prior to said securing said elongate conductor, forming in a first expansive side of said precursor substrate a first channel for receiving said elongate conductor therein.

4. The method of claim 3, wherein said removing said portions of said precursor substrate includes removing material from a second side of said precursor substrate opposite said first side so as to expose said first channel and liberate from said precursor substrate said composite member along a first longitudinal side of said composite member.

5. The method of claim 3, further comprising, prior to said securing said elongate conductor, forming in said first expansive side of said precursor substrate a second channel spaced from said first channel so as to define a second longitudinal side of said composite member.

6. The method of claim 5, wherein said removing said portions of said precursor substrate includes removing material from a second side of said precursor substrate opposite said first side so as to expose each said first channel and said second channel and liberate from said precursor substrate said composite member along opposite sides of said composite member.

7. The method of claim 1, wherein said providing said precursor substrate includes providing a substantially single-crystal substrate.

8. The method of claim 7, wherein said providing said precursor substrate includes providing a semiconductor substrate.

9. The method of claim 1, further comprising removing material from said precursor substrate so that said at least three FETs are discretely spaced along said composite member.

10. The method of claim 1, wherein said partially forming each of said at least three FETs includes arranging said at least three FETs along a number N of lines spaced from one another, wherein N is an integer greater than one, the method including:
   securing said number N of elongate conductors to ones of said at least three FETs along corresponding respective ones of said lines, wherein said number N of elongate conductors exist prior to said securing; and, then,
   removing portions of said precursor substrate so as to liberate said number N of composite members from said precursor substrate.

11. The method of claim 10, wherein said partially forming said at least three FETs includes making a portion of each of said at least three FETs in a roll-to-roll process.

12. The method of claim 10, wherein said partially forming said at least three FETs includes making a portion of each of said at least three FETs in a substantially continuous roll-to-roll process.

13. A method of making an electronic component, comprising:
   forming a plurality of strands each in accordance with claim 1 so that said plurality of strands has a plurality of first elongate conductors incorporated into corresponding respective ones of said plurality of strands; and
   incorporating said plurality of strands into an electronic component.

14. The method of claim 13, wherein the incorporating of said plurality of strands into said electronic component includes weaving ones of said plurality of strands with a plurality of second elongate conductors.

15. The method of claim 13, wherein the incorporating of said plurality of strands into said electronic component includes configuring ones of said plurality of electronic device strands relative to a plurality of second elongate conductors in a non-woven manner.

16. A method of making an electronic component, comprising:
   making a strand in accordance with claim 1, said strand having a circumference and a length and comprising a plurality of FETs located along said length, each of said FETs including a source/drain layer, an active channel region, a gate insulator layer atop said active channel region, and a gate metal layer around said circumference atop said gate insulating layer;
   providing a permanent substrate having a plurality of gate electrodes;

securing said plurality of FETs to said permanent substrate so that ones of said gate metal layer are in electrical communication with ones of said plurality of gate electrodes;

substantially encasing said plurality of FETs in an encasing insulator layer; and depositing a source/drain electrode layer over said insulator layer so that said source/drain electrode layer is in electrical communication with each said source/drain layer.

17. A method of making an electronic component, comprising:

making a strand in accordance with claim 1, said strand having a circumference and a length and comprising a plurality of FETs located along said length, each of said FETs including a source/drain layer and an active channel region, a gate insulator layer atop said active channel region, and a gate metal layer around said circumference atop said gate insulating layer;

providing a permanent substrate;

securing said plurality of FETs to said permanent substrate; and depositing a first insulator layer so as to substantially cover each of said plurality of FETs;

depositing a gate electrode layer on said first insulator layer so that said electrode layer is in electrical communication with each said gate metal layer;

depositing a second insulator layer atop said gate electrode layer; and depositing a source/drain electrode layer over said second insulator layer so that said source/drain electrode layer is in electrical communication with each said source/drain layer.

18. An electronic article, comprising:
an electronic component that includes:
a permanent substrate;
a plurality of gate control wires formed on said permanent substrate; and
a plurality of FETs, each formed in accordance with claim 1, secured to said permanent substrate and in electrical communication with said plurality of gate control wires.

19. The electronic article of claim 18, wherein said electronic component is a flexible component.

20. The electronic article of claim 18, wherein said electronic component is a conformal component.

21. The electronic article of claim 18, wherein said electronic component is a rollable component.

22. The electronic article of claim 18, wherein said electronic component is a foldable component.

23. The electronic article of claim 18, wherein said electronic component is a display.

24. The electronic article of claim 18, wherein said electronic component is a sensor.

25. The method of claim 1, wherein each of said at least three FETs includes a source, a drain and a channel, said at least partially forming including forming said source, said drain and said channel of each of said at least three FETs, and said securing said elongate conductor includes making electrical contact between said elongate conductor and one of said source and said drain of each of said at least three FETs, the method further including, after liberating said composite member, processing said composite member so that each of said at least three FETs includes an insulating layer substantially surrounding said elongate conductor at said one of said source and said drain electrically connected to said elongate conductor and so that a metal gate layer substantially surrounds said insulating layer at each of said at least three FETs.

26. A method of making at least one field-effect transistor (FET) strand, comprising:

providing a precursor substrate;

providing a discrete elongate conductor;

forming a plurality of FETs on said precursor substrate, said plurality of FETs having a plurality of corresponding respective source regions, a plurality of corresponding respective drain regions and a plurality of corresponding respective gate regions;

after providing said discrete elongate conductor, securing said discrete elongate conductor to said plurality of corresponding respective source regions so as to electrically connect said plurality of corresponding respective source regions together; and following said securing said elongate conductor, liberating an FET composite member from said precursor substrate.

27. The method of claim 26, further comprising forming a first channel extending alongside said plurality of corresponding respective source regions, said securing said discrete elongate conductor to said plurality of corresponding respective source regions including locating said discrete elongate conductor in said first channel.

28. The method of claim 26, further comprising forming each of a first channel and a second channel in a first expansive side of said precursor substrate, said first channel extending alongside said plurality of corresponding respective source regions and said second channel extending alongside said plurality of corresponding respective drain regions, said liberating said FET strand including removing material from a second expansive side opposite said first expansive side so as to expose each of said first channel and said second channel.

29. The method of claim 26, further comprising processing said composite member so as to form a gate electrode of each of said plurality of FETs.

30. The method of claim 29, wherein said processing said composite member includes selectively depositing an insulating layer on said composite member, conformally depositing a metal gate layer over said insulating layer, and patterning said metal gate layer so as to form said gate electrode of each of said plurality of FETs.

31. A method of making an electronic component, comprising:

forming at least one field-effect transistor (FET) strand in accordance with claim 26 so that said at least one FET strand contains a plurality of FETs; and utilizing ones of said plurality of FETs in making an electronic component by electrically interconnecting ones of said plurality of FETs together into an electronic circuit.

* * * * *